US009287269B2

(12) United States Patent
Toh et al.

(10) Patent No.: US 9,287,269 B2
(45) Date of Patent: Mar. 15, 2016

(54) 1T SRAM/DRAM

(71) Applicant: GLOBALFOUNDRIES Singapore Pte. Ltd., Singapore (SG)

(72) Inventors: Eng Huat Toh, Singapore (SG); Danny Pak-Chum Shum, Singapore (SG); Shyue Seng Tan, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 114 days.

(21) Appl. No.: 14/173,831

(22) Filed: Feb. 6, 2014

(65) Prior Publication Data

US 2015/0221652 A1    Aug. 6, 2015

(51) Int. Cl.
| | | |
|---|---|---|
| H01L 27/108 | (2006.01) | |
| H01L 21/762 | (2006.01) | |
| H01L 27/11 | (2006.01) | |
| H01L 29/10 | (2006.01) | |
| H01L 29/78 | (2006.01) | |
| H01L 29/66 | (2006.01) | |
| H01L 29/165 | (2006.01) | |

(52) U.S. Cl.
CPC ........ *H01L 27/10802* (2013.01); *H01L 21/762* (2013.01); *H01L 27/11* (2013.01); *H01L 29/1054* (2013.01); *H01L 29/66545* (2013.01); *H01L 29/66651* (2013.01); *H01L 29/7841* (2013.01); *H01L 29/165* (2013.01); *H01L 29/665* (2013.01); *H01L 29/6659* (2013.01)

(58) Field of Classification Search
CPC ..................... H01L 27/10802; H01L 27/7841; H01L 27/11
See application file for complete search history.

(56) References Cited

U.S. PATENT DOCUMENTS

| | | | | |
|---|---|---|---|---|
| 2002/0037619 A1* | 3/2002 | Sugihara et al. | ............... | 438/289 |
| 2013/0264656 A1* | 10/2013 | Widjaja et al. | ................ | 257/402 |

* cited by examiner

*Primary Examiner* — Ha Tran T Nguyen
*Assistant Examiner* — Aaron Dehne
(74) *Attorney, Agent, or Firm* — Horizon IP Pte. Ltd.

(57) ABSTRACT

One-transistor volatile memory devices and manufacturing methods thereof are provided. The device includes a substrate having top and bottom surfaces and an isolation well disposed below the top substrate surface. An area of the substrate between the isolation buffer layer and the top substrate surface serves as a body region of a transistor. The isolation well isolates the body region from the substrate. The device includes a band engineered (BE) floating body disposed over the isolation well and within the body region. The device also includes a transistor disposed over the substrate. The transistor includes a gate disposed on the top substrate surface, and first and second diffusion regions disposed in the body region adjacent to first and second sides of the gate.

20 Claims, 20 Drawing Sheets

1T SRAM/DRAM

BACKGROUND

Volatile memory systems, such as random-access memory (RAM), are widely used as a form of primary data storage in computer memories. Volatile memory devices perform read and write operations quickly, allowing fast access to transiently stored data when the memory devices are powered. The stored data is lost when the devices are not powered. Presently, volatile memory devices are utilized in a wide range of applications including, for example, mobile phones, digital cameras, personal computers, and other applications where permanent data storage is not required or when fast data manipulation is desired. Typical volatile memory devices include, for example, Static RAM (SRAM) and Dynamic RAM (DRAM). Volatile memory devices are widely implemented in the form of embedded memory.

In recent years, development in RAM technology has presented floating body cells (FBCs) as an alternative data storage solution to conventional DRAM and SRAM, combining fast operation with high packing density. Volatile memory cells that rely on a floating body for data storage are thus known as floating body RAM (FBRAM). However, current process methods to manufacture FBRAMs face limitations with regard to manufacturing costs, operation voltage, and data retention period.

From the foregoing discussion, there is a need to provide improved RAM devices as well as simplified and cost effective methods to form such devices.

SUMMARY

Embodiments generally relate to memory devices. In one embodiment, a device is presented. The device includes a substrate having top and bottom surfaces and an isolation well disposed below the top substrate surface. An area of the substrate between the isolation buffer layer and the top substrate surface serves as a body region of a transistor. The isolation well isolates the body region from the substrate. The device includes a band engineered (BE) floating body disposed over the isolation well and within the body region. The device also includes a transistor disposed over the substrate. The transistor includes a gate disposed on the top substrate surface, and first and second diffusion regions disposed in the body region adjacent to first and second sides of the gate.

In another embodiment, a method for forming a device is disclosed. The method includes providing a substrate having top and bottom surfaces and forming an isolation well below the top substrate surface. An area of the substrate between the isolation buffer layer and the top substrate surface serves as a body region of a transistor, and the isolation well isolates the body region from the substrate. A band engineered (BE) floating body is formed over the isolation well and within the body region and a transistor is formed over the substrate. The formation of the transistor includes forming a gate on the top substrate surface, and forming first and second diffusion regions in the body region adjacent to first and second sides of the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, such as semiconductor devices or ICs. Particularly, some embodiments relate to memory devices, such as volatile memory devices. More particularly, some embodiments relate to FBRAM devices. Such memory devices, for example, can be incorporated into standalone memory devices, such as signal processors, or ICs, such as microcontrollers or system on chips (SoC). The devices or ICs can be incorporated into or used with, for example, consumer electronic products, such as computers, cell phones, or relate to other types of devices.

A volatile memory device according to the present disclosure offers a number of advantages compared to existing volatile devices. For instance, the substrate manufacturing cost is reduced, while data retention period and overall memory cell performance are improved.

Figure 1:
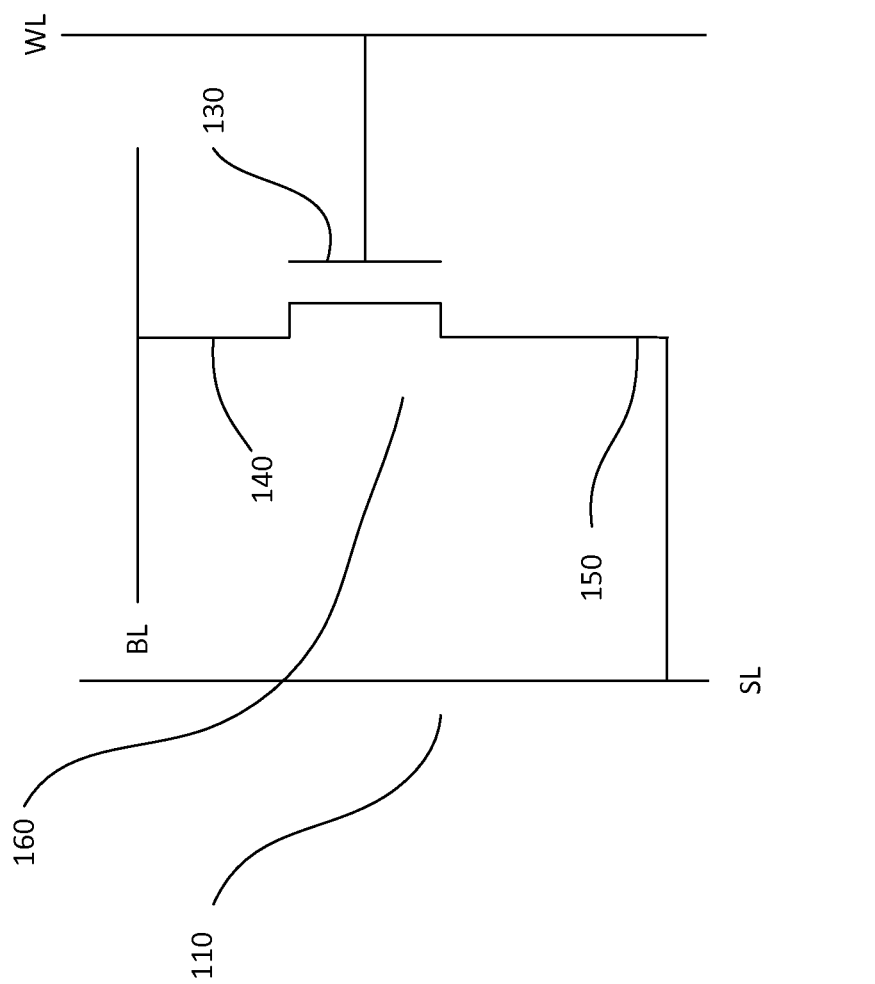
FIG. 1 shows a circuit diagram in accordance with an embodiment of a device.

FIG. 1 shows a schematic diagram of an embodiment of a device. In one embodiment, the device includes a memory cell 100. The memory cell, in one embodiment, is a volatile memory cell. In one embodiment, the volatile memory cell is a one transistor DRAM (1T-DRAM) cell. In another embodiment, the volatile memory cell is a one transistor SRAM (1T-SRAM) cell. Other types of devices or memory cells may also be useful.

As shown, the memory cell includes a transistor 110. The transistor includes first and second source/drain (S/D) terminals 140 and 150. The transistor further includes a gate terminal 130 disposed between the first and second S/D terminals. The first S/D terminal is coupled to a bitline (BL) and the second S/D terminal is coupled to a source line (SL). As for the gate terminal, it is coupled to a word line (WL). The WL is along a first direction and the BL is along a second direction. As for the SL, it may be disposed in the first direction. The first and second directions, for example, are orthogonal to each other. The SL, for example, is coupled to ground. Alternatively, the SL could be coupled to a bias voltage.

The transistor includes a body 160. In one embodiment, the transistor body is a floating transistor body. For example, the transistor body is isolated from a substrate on which the transistor is formed. The transistor is isolated from the semiconductor substrate by an isolation well. The semiconductor substrate, for example, is a single crystalline substrate, such as silicon. In one embodiment, the isolation well may be part of the substrate. The isolation well, in one embodiment, includes first polarity type dopants.

The floating body serves as a storage element employed for storing information. By providing the appropriate bias at the BL and WL, charge carriers may accumulate at or dissipate from a storage region of the body. In the case of a nMOS cell, the charge carriers are holes while in the case of a pMOS cell, the charge carriers are electrons. In one embodiment, the storage region is located near the isolation well/floating body interface. In another embodiment, the storage region is within the floating body, such as within a band engineered floating body as will be described later. Providing a storage region at other suitable locations may also be useful. The presence or absence of the accumulation layer corresponds to first and second states of the memory cell, such as a logic "1" or logic "0". For example, writing a logic "1" to the memory cell may include forming the accumulation layer by impact ionization. Alternatively, writing a logic "0" to the memory cell may include removing the accumulation layer.

A plurality of memory cells may be interconnected by BLs and WLs to form an array. The SL may be a common SL for cells of the array. Each memory cell is capable of different operations including read, program (PGM) and erase (ERS). The operating voltages for different terminals of selected and unselected cells are shown in Table 1 below.

TABLE 1

| Operation | SL_Sel | SL_UnSel | BL_Sel | BL_UnSel | WL_Sel | WL_UnSel |
|---|---|---|---|---|---|---|
| Read | GND | GND or Vinhibit | VBL_RD (+) | GND or Vinhibit | VWL_RD (+) | GND or Vinhibit |
| PGM | GND | GND or Vinhibit | VBL_PGM (+) | GND or Vinhibit | VWL_PGM (+) | GND or Vinhibit |
| ERS | GND | GND or Vinhibit | VBL_ERS (−) | GND or Vinhibit or VBL_ERS (−) If page ERS | VWL_ERS (+) | GND or Vinhibit or VWL_ERS (+) If page ERS |

Figure 2A:
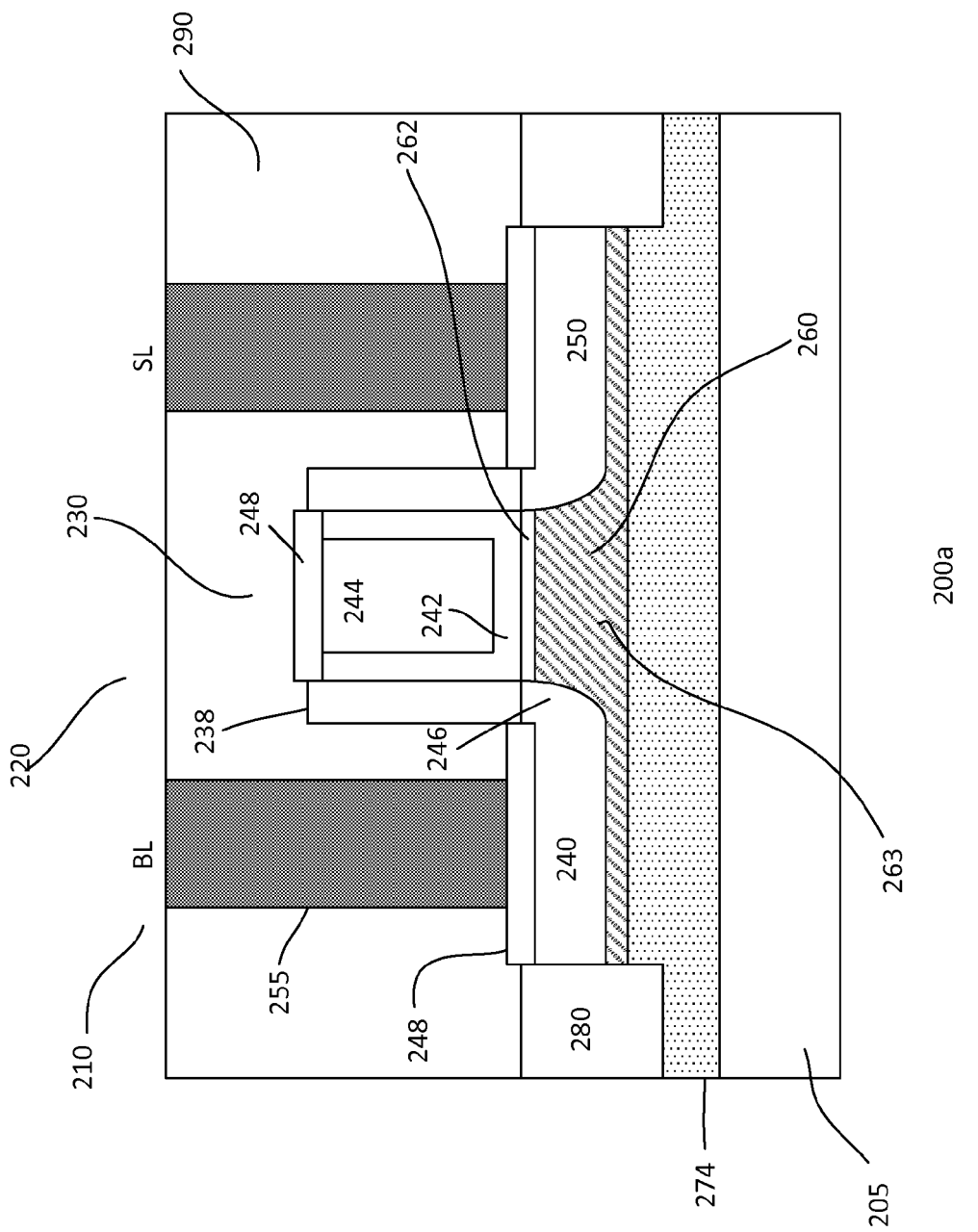
FIGS. 2a-2b show cross-sectional views of other embodiments of a device.
Figure 2B:
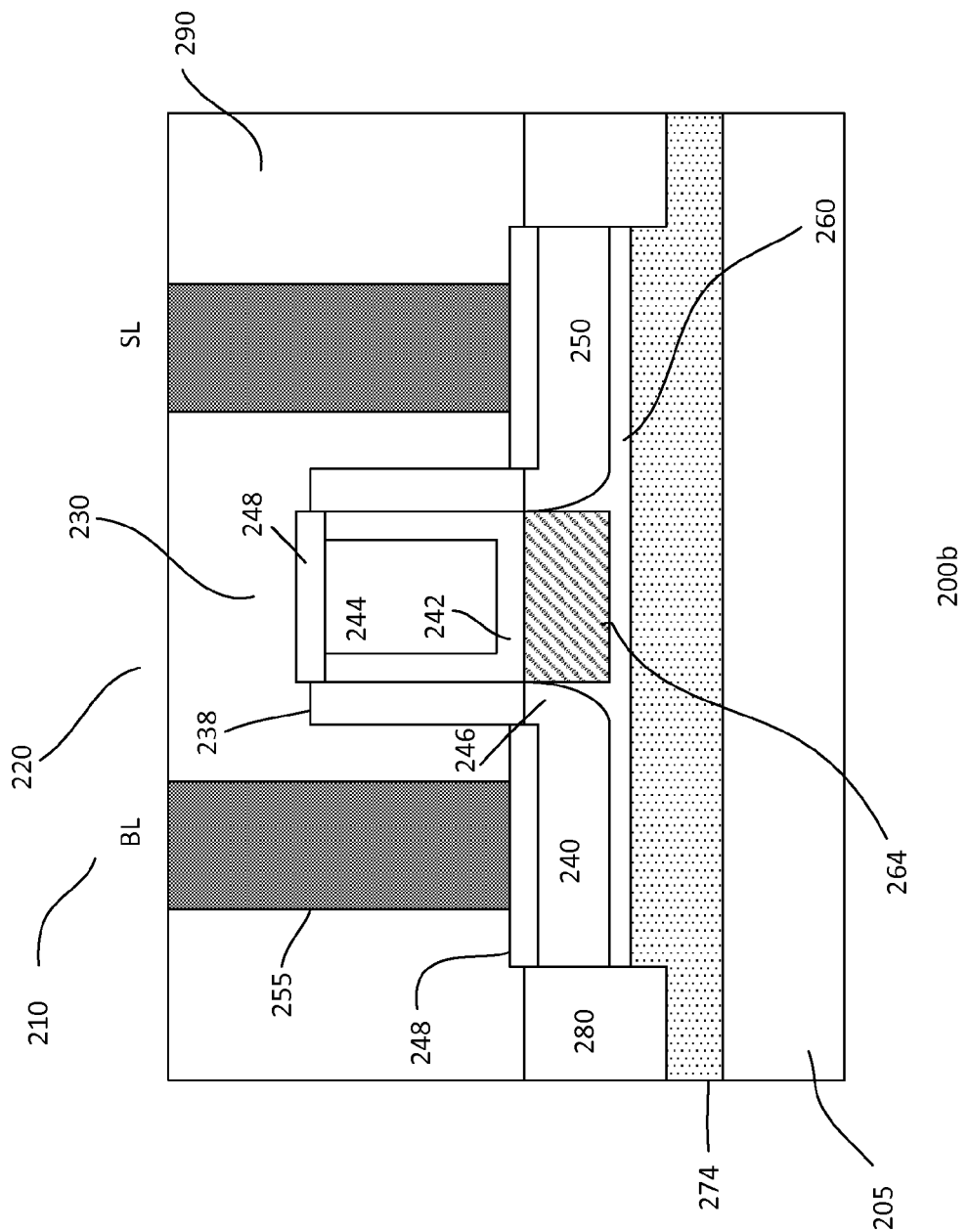

FIGS. 2a-2b show cross-sectional views of various embodiments of a portion of a device. The device, for example, is an IC. Other types of devices may also be useful. The device includes a transistor.

As shown in FIG. 2a, the device 200a includes a substrate 205. The substrate, for example, is a semiconductor substrate, such as a silicon substrate. In one embodiment, the substrate is a p-type doped substrate. For example, the p-type doped substrate is a lightly doped p-type substrate. Other types of semiconductor substrates may also be useful. For example, semiconductor substrates such as silicon germanium, gallium or gallium arsenide may also be useful.

The substrate includes a device region 220. The device region, for example, is surrounded by an isolation region 280. The isolation region may be used to separate the device region from other device regions on the substrate (not shown). The isolation region, for example, is a shallow trench isolation (STI) region. Other types of isolation regions may also be employed. The STI region, for example, extends to a depth of about 2000-5000 Å. Providing STI regions which extend to other depths may also be useful. As shown, the depth of the STI should extend below the top of an isolation well 274.

In accordance with an embodiment, the isolation well 274 is disposed in the substrate. In one embodiment, the isolation well serves to isolate the transistor body from the substrate. The isolation well, in one embodiment, includes first polarity type dopants. The dopant concentration of the isolation well may be about, for example, 1e16-1e18 cm$^{-3}$. Other suitable dopant concentrations may also be useful. In one embodiment, the isolation well extends from below first and second diffusion or source/drain (S/D) regions 240 and 250 (as will be described later) to a depth below the bottom of the isolation regions 280. In one embodiment, the isolation well may be part of the substrate. For example, dopants are implanted into the substrate to form the isolation well. Other techniques for providing the isolation well may also be useful. For example, the isolation well may be an epitaxial isolation well. In such case, the epitaxial isolation well may be formed prior to forming the isolation regions 280. The epitaxial isolation well may be in-situ doped Implanting the epitaxial isolation well may also be useful.

As for the transistor 210, it includes a gate 230 disposed on the substrate in the device region 220. The gate, in one embodiment, includes a gate electrode 244 and a gate dielectric 242. The gate dielectric layer, for example, is disposed between the gate electrode and the substrate. The gate electrode, for example, includes a polysilicon gate electrode. Other types of gate electrode materials may also be useful. For example, providing a metal gate electrode may also be useful. For illustration purpose, the gate 230 is a high-k metal gate. For example, the gate electrode 244 may be a metal gate electrode, such as TaN or TiN. As for the gate dielectric layer 242, it may be a high-k gate dielectric, such as HfSiON, SiON or HfO$_2$. Other types of gate dielectrics may also be useful. In some embodiments, the gate dielectric may further include a work function tuning layer. For example, La$_2$O$_3$ may be provided for an n-type device while TiN/Al/TiN may be provided for a p-type device in addition to HfSiON and/or HfO$_2$. Other configurations of gates may also be useful. The gate, for example, may include a composite gate electrode having multiple gate electrode layers, a composite gate dielectric layer having multiple gate dielectric layers or a combination thereof. As shown, the gate dielectric 242 surrounds sides and bottom of the gate electrode 244. For example, such a configuration may result from a gate last process to form the transistor.

Dielectric spacers 238 may be provided on sidewalls of the gate. The dielectric spacers, for example, may be silicon nitride. Other types of dielectric materials may also be used. For example, the spacers may be silicon nitride or multiple layers of dielectric materials, such as silicon oxide and silicon nitride. In other embodiments, no dielectric spacers are provided on the gate sidewalls. The gate, for example, is a gate conductor which serves as a common gate for a plurality of transistors. The gate conductor, for example, is along a first direction.

As for the body 260 of the transistor, it includes second polarity type dopants. For example, the second polarity type dopants are for a first polarity type transistor. In one embodiment, the body is lightly or intermediately doped with second polarity type dopants. For example, in the case where first polarity type is n-type, the body may be a lightly or intermediately doped p-type substrate. Other dopant concentrations may also be useful. In the case where the body is doped differently from the substrate, a second polarity type lightly doped region may be provided, such as by implantation. Other configurations of the body may also be useful.

In one embodiment, the body 260 of the transistor includes a band engineered (BE) floating body. In one embodiment, the BE floating body 263 is disposed over the isolation well. The BE floating body 264, in one embodiment, is a silicon germanium (SiGe) BE floating body. Other suitable types of BE floating body may also be useful. The BE floating body, in one embodiment, is an epitaxial BE body. The BE body, as shown, contacts the isolation well. The BE body, for example, is lightly doped with second polarity type dopants. For example, the BE body may be in-situ doped. Other suitable techniques for forming the BE body may also be useful. S/D regions 240 and 250 of the transistor, as will be described later, are formed in the BE floating body. In one embodiment, a channel layer 262 is disposed over the BE body. The channel layer, in one embodiment, is a Si:C layer. The channel layer may be an epitaxial channel layer. The epitaxial channel layer, for example, may be in-situ doped or implanted with second polarity type dopants. The thickness of the channel layer is about, for example, 5-100 nm. Other suitable thickness dimension for the channel layer may also be useful.

First and second diffusion or S/D regions 240 and 250 are disposed in the substrate in the body region 260 adjacent to first and second sides of the gate. In one embodiment, the S/D regions include first polarity type dopants for a first polarity type transistor. For example, the S/D regions may be doped with n-type dopants for a n-type transistor, such as a n-type metal oxide semiconductor (nMOS) transistor. The S/D regions, in one embodiment, are heavily doped first polarity type region. For example, the dopant concentration of the S/D regions may be about $10^{18}$-$10^{20}$ atom/cm$^3$. As shown, the depth or bottom of the S/D regions is shallower than the isolation well. For example, the BE floating body 263 separates the S/D regions from the isolation well. The separation distance between the S/D regions and the isolation well, for example, should be sufficient such that the depletion width from the S/D regions and the isolation well does not merge.

In some embodiments, the S/D regions may be provided with S/D extension regions 246. The S/D extension regions may be lightly doped portions of the S/D regions. The dopant concentration of the S/D extension regions may be about, for example, 1e17-1e20 cm$^{-3}$. Other suitable dopant concentrations for the S/D extension regions may also be useful. The S/D extension regions, for example, extend beneath the spacers to connect the channel to the S/D regions. In some embodiments, the S/D extension profile may extend beneath the gate. Providing a S/D extension profile which underlaps the gate may increase resistance and have better short channel effect. The spacers facilitate forming the S/D extension regions. For example, S/D extension regions are formed prior to forming spacers while S/D regions are formed after.

In one embodiment, metal silicide contacts 248 are formed on the contact or terminal regions of the transistor. For example silicide contacts are disposed on the gate electrode and S/D regions. The metal silicide contacts may be nickel-based silicide contacts. Other types of silicide contacts may also be useful. The contacts may be about 100-500 Å thick. Other thickness of contacts may also be useful. The silicide contacts may be employed to reduce contact resistance and facilitate contact to the back-end-of-line (BEOL) metal interconnects.

A dielectric layer 290 is disposed over the transistor. The dielectric layer, for example, serves as a pre-metal dielectric (PMD) layer. The dielectric layer may be a silicon oxide dielectric layer. Other types of dielectric layers may also be useful. For example, the dielectric layer may be a high aspect ratio process (HARP) dielectric layer. Via contacts 255 may be provided in the dielectric layer to connect to the terminals of the transistor. For example, first S/D via contact connecting to the first S/D region and second S/D via contact connecting to the second S/D region may be provided. A gate terminal contact (not shown), which connects to the gate, may also be provided. In one embodiment, the first S/D is coupled to a BL, the second S/D is coupled to a SL and the gate is coupled to a WL (not shown), forming a 1T-SRAM cell.

As described, the transistor body is isolated from a substrate by an isolation well. Providing an isolation well improves the floating body of the transistor. For example, this enables better retention time, reduced charge leakage and avoids the use of silicon-on-insulator substrate which is relatively costly, thereby lowering the manufacturing costs. In addition, a BE floating body is provided along with the isolation well. The BE floating body reduces operating voltage of the device. Furthermore, improved read/write speed can be achieved along with improved retention time. Also, the BE floating body enables non-destructive read operations.

FIG. 2b shows another embodiment of a device 200b. The device is similar to that described in FIG. 2a. Common elements may not be described or described in detail. As shown, the device includes a metal gate. The metal gate, for example, includes gate dielectric 242 which surrounds the sides and bottom of the gate electrode 244. An isolation well 274 is provided to isolate the floating body 260 from the substrate.

In one embodiment, the body 260 of the transistor includes a band engineered (BE) floating body. In one embodiment, the floating body includes a BE portion 264. The BE portion is disposed in the body below the gate and between the S/D regions. As shown, the BE portion has a depth equal to about the depth of the S/D regions, leaving a gap in between the BE portion and the isolation well. The gap, for example, may prevent charge carriers from leaking out. Other suitable depths or configuration of the BE portion may also be useful. The BE portion, in one embodiment, is a silicon germanium (SiGe) BE portion. The BE portion, for example, may be lightly doped with second polarity type dopants. Other suitable types of BE portions may also be useful. For applications with BE portion, the body may be Si:C. For example, the body may be doped with C dopants. The concentration of C may be about, for example, 1-3%. Other techniques for providing a Si:C body may also be useful. For example, the body may be an epitaxial Si:C body. The epitaxial body may be in-situ doped. Implanting the epitaxial body may also be useful. For applications without a BE portion, S/D regions may be doped with C dopants. For example, Si:C S/D regions may be disposed within a Si body.

Figure 3A:
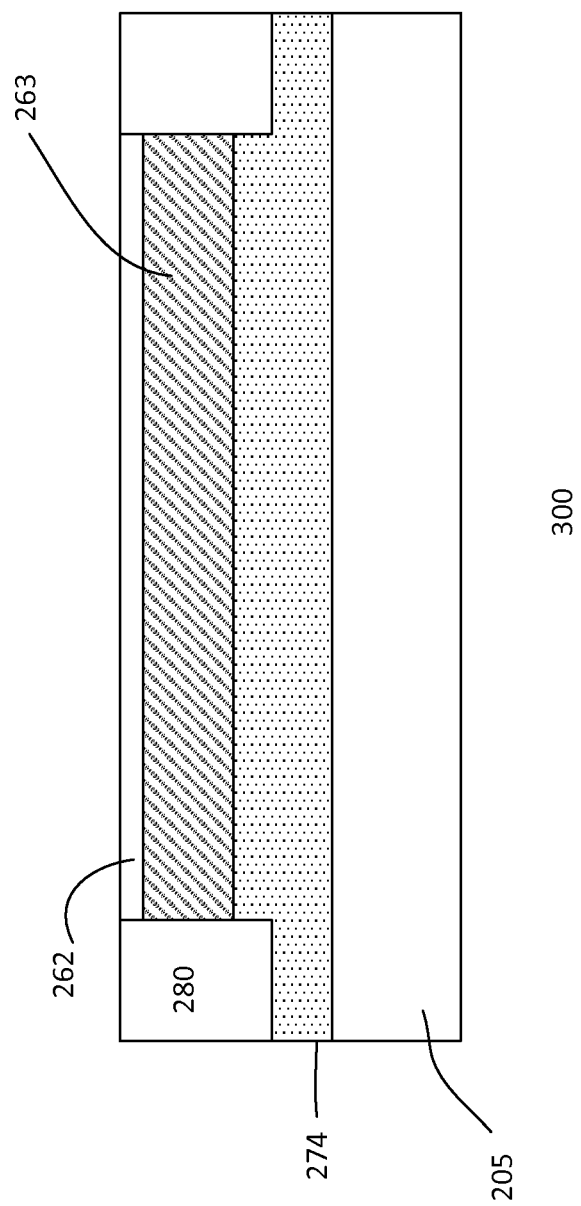
FIGS. 3a-3e show cross-sectional views of a process for forming an embodiment of a device.

FIGS. 3a-3e show cross-sectional views of an embodiment of a process for forming a portion of a device or IC. Referring to FIG. 3a, a substrate 205 is provided. The substrate serves as a base for the device 300. The substrate, for example, is a semiconductor substrate, such as a silicon substrate. In one embodiment, the substrate is a p-type doped substrate. For example, the p-type doped substrate is a lightly doped p-type substrate. Other suitable types of semiconductor substrates may also be useful.

The substrate includes a device region. The device region, in one embodiment, serves as a cell region for a memory cell. In one embodiment, the cell region serves as a device region of a 1T-SRAM cell. Isolation regions 280 are formed in the substrate 205. The isolation region serves to isolate the cell region from other device regions (not shown). The isolation region, for example, is a shallow trench isolation (STI)

region. Other types of isolation regions may also be useful. The STI region, for example, extends to a depth of about 2000-5000 Å. Providing STI regions which extend to other depths may also be useful. As shown, the depth of the STI should extend below an isolation well 274. Various processes can be employed to form the STI region. For example, the substrate can be etched using etch and mask techniques to form trenches which are then filled with dielectric materials such as silicon oxide. Chemical mechanical polishing (CMP) can be performed to remove excess oxide and provide a planar top surface. Other processes or materials can also be used to form the STI.

As shown, the substrate includes one device region. It is, however, understood that the substrate may include a plurality of device regions. For example, numerous cell regions may be provided in an array region to form a plurality of memory cells. In some cases, one memory cell may occupy one cell region. For example, an isolation region may surround a cell region. Other configurations of memory cells, device regions, and isolation regions may also be useful. For example, isolation regions may be used to isolate BLs of adjacent memory cells and adjacent gates of adjacent rows. In such a case, isolation regions may be provided to partially surround the cell region on all sides of the cell but does not completely surround it.

The process continues to form an isolation well 274. The isolation well, in one embodiment, includes first polarity type dopants. The first polarity type dopants, for example, are n-type dopants. The dopant concentration is, for example, 1e16-1e18 $cm^{-3}$. Other suitable types of dopants and dopant concentrations may also be useful. In one embodiment, the isolation well 274 extends to a depth below the isolation regions 280. For example, the isolation regions extend into a portion of the isolation well. Other depths may also be useful. The isolation well 274, for example, may be part of the substrate. For example, dopants are implanted into the substrate to form the isolation well. Providing other implant energies and doses may also be useful. The implant parameters, such as energy and dose, are tailored to produce the isolation well at the desired location and have the desired effect. By adjusting the energy and dose of the implant, the location and thickness of the isolation well can be controlled. Other techniques for providing the isolation well may also be useful. For example, the isolation well may be an epitaxial isolation well. In such case, the epitaxial isolation well may be formed prior to forming the isolation regions 280. The epitaxial isolation well may be in-situ doped Implanting the epitaxial isolation well may also be useful.

Referring to FIG. 3a, the process continues to form a BE floating body 263 over the isolation well 274. The BE floating body, in one embodiment, is a SiGe BE floating body. The BE floating body 263, for example, is formed by an epitaxial process. The epitaxial BE floating body, for example, is lightly doped with second polarity type dopants. The epitaxial BE body, for example, may be in-situ doped with second polarity type dopants. Other suitable techniques for forming the BE floating body may also be useful.

A channel layer 262 is formed over the BE floating body 263. The channel layer, in one embodiment, is a Si:C layer. The channel layer may be formed by an epitaxial process. In another embodiment, the epitaxial channel layer may be in-situ doped with second polarity type dopants. Implanting the epitaxial channel layer with second polarity type dopants may also be useful. The thickness of the channel layer is about, for example, 5-100 nm. Other suitable materials and techniques may also be useful.

Figure 3B:
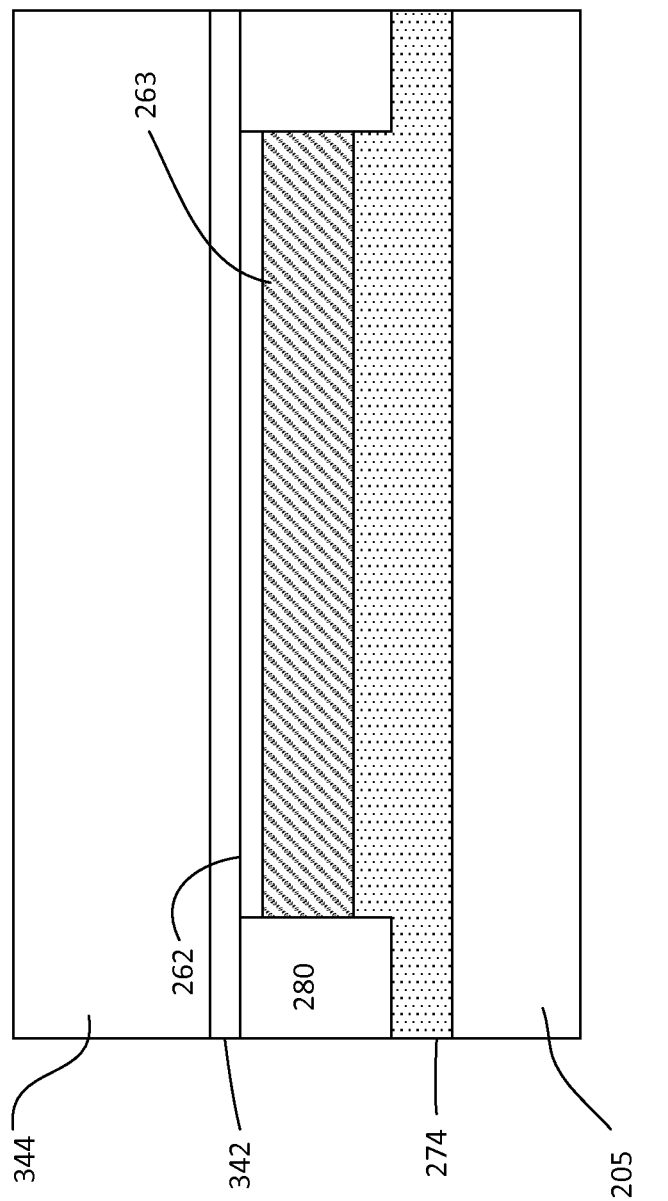

The process continues to form a gate dielectric layer 342 and a gate electrode layer 344 over the top surface of the substrate as shown in FIG. 3b. The gate dielectric layer, for example, includes silicon oxide ($SiO_2$). Alternatively, it may be a high-k gate dielectric layer, such as HfSiON, SiON or $HfO_2$. Other suitable types of dielectric materials may be useful. The dielectric layer is formed by, for example, thermal oxidation, chemical vapor deposition (CVD) or atomic layer deposition (ALD). The thickness of the dielectric layer, for example, may be about 1-50 nm, depending on the k-value. Other suitable techniques for forming or other thickness ranges may also be useful for the gate dielectric layer. The gate electrode layer, for example, includes polysilicon, metal or metal nitride. Various suitable types of metal, such as Ru, W, Pt, TiN, Ti, Zr, TaN, Si or Al, can be used. Other suitable types of metals may also be useful. The thickness of the gate electrode can be about 10-200 nm. Various techniques can be used to form the gate electrode layer. For example, polysilicon can be deposited by CVD while metal can be deposited by sputtering. Other suitable techniques for forming and other suitable thickness dimensions for the gate electrode layer may also be useful.

In some embodiments, the gate dielectric may further include a work function tuning layer formed in between the gate dielectric and the metal gate electrode layer. For example, $La_2O_3$ may be formed for an n-type device while TiN/Al/TiN may be formed for a p-type device in addition to HfSiON and/or $HfO_2$. Other configurations of gates may also be useful. The gate, for example, may include a composite gate electrode having multiple gate electrode layers, a composite gate dielectric layer having multiple gate dielectric layers, or a combination thereof.

Figure 3C:
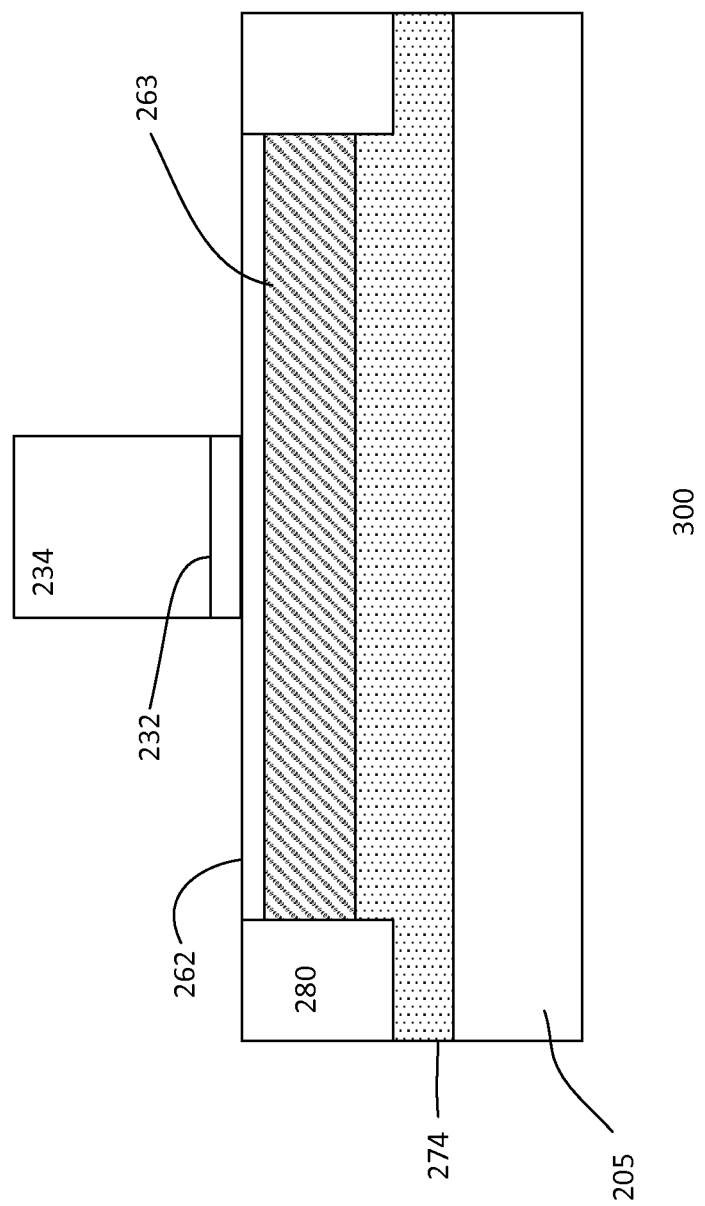

Referring to FIG. 3c, the gate layers are processed to form a gate 230 having a patterned gate dielectric 232 and gate electrode 234. In one embodiment, the gate layers are patterned to form a gate conductor. The gate conductor may traverse other cell regions. In other embodiments, the gate layers are patterned to form an individual gate in the cell region. The patterning of the gate layers can be achieved, for example, by mask and etch techniques. For example, a patterned photoresist mask may be used as an etch mask for an anisotropic etch, such as a reactive ion etch (RIE). To improve lithographic resolution, an ARC can be provided beneath the photoresist. Other techniques for patterning the gate layers may also be useful. After patterning the gate layers, the mask, including the ARC layer, may be removed.

The process continues to form lightly doped regions 246 in the BE floating body region 263 adjacent to first and second sides of the gate. The lightly doped region has first polarity type dopants. To form the lightly doped region, first polarity type dopants are implanted into the substrate. The implant, for example, may be self-aligned with respect to the gate 230. For example, the implant may dope the substrate unprotected by the gate and isolation region 280. The depth of the lightly doped region, for example, is about 5-50 nm. Other suitable depth dimensions may also be useful, depending on technology node. The implant dose may be about 1e14-3e15 $cm^{-2}$. Other suitable implant parameters may also be useful. An implant mask which exposes the device region may be provided to perform the implant. The implant mask, for example, may be a photoresist layer. Other suitable types of implant masks may also be useful.

Figure 3D:
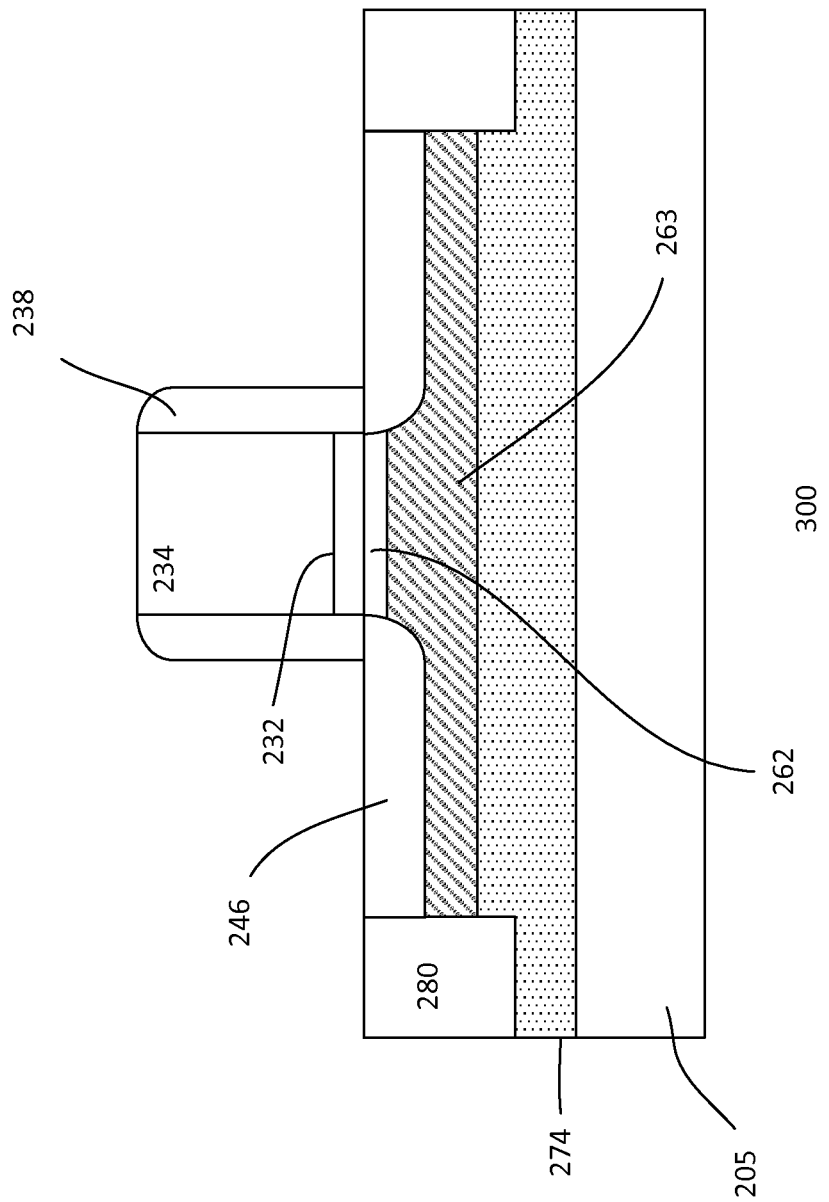

Sidewall spacers 238 may be formed over the first and second gate sidewalls. To form the sidewall spacers 238, a spacer layer is deposited on the substrate. The spacer layer, for example, may be silicon nitride. Other suitable types of dielectric material, such as silicon oxide or silicon oxynitride may also be used. The spacer layer may be formed by CVD. The spacer layer may also be formed using other techniques. The thickness of the spacer layer may be about, for example, 5-50 nm. Other thickness ranges may also be useful. The thickness, for example, may depend on the desired width of the spacers. An anisotropic etch, such as RIE, may be performed to remove horizontal portions of the spacer layer, leaving spacers 238 on the sidewalls of the gate as shown in FIG. 3d.

Figure 3E:
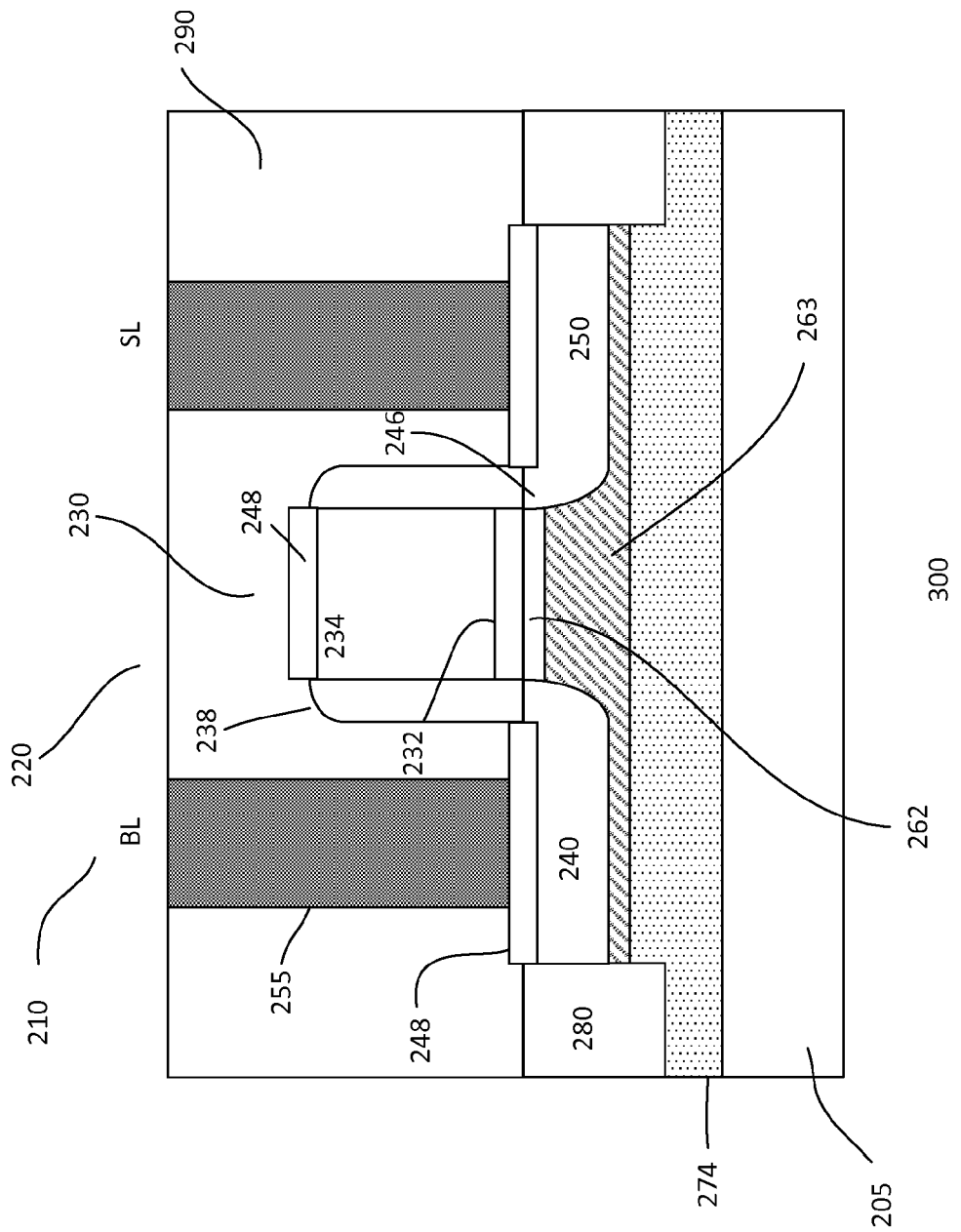

The process continues to form first and second S/D regions 240 and 250 as shown in FIG. 3e. In one embodiment, trenches may be formed in portions of the BE region 263 of the floating body and epitaxial S/D layers are formed in the trenches. The epitaxial S/D layers, in one embodiment, are in-situ doped. Doping the epitaxial layers with first polarity type dopants by ion implantation may also be useful. The depth of the S/D regions, for example, is about 5-50 nm. The implant dose, for example, may be about 1e15-5e15 cm$^{-2}$. Other suitable implant parameters may also be useful. The implantation parameters, for example, are selected to form S/D regions having a depth shallower than the isolation well. For example, as shown in FIG. 3e, the BE region separates the S/D regions from the isolation well. Other suitable configurations for the S/D regions may also be useful. The dopants may be activated by, for example, annealing. The annealing, for example, may be rapid thermal annealing. Other types of thermal processes for activating the dopants may also be useful. For example, the annealing may include laser annealing.

The process may continue to complete the memory cell until a memory cell shown in FIG. 3e is formed. For example, metal silicide contacts 248 may be formed on the gate electrode 234 and first and second S/D regions 240 and 250. The metal silicide contacts, for example, may be nickel-based metal silicide contacts. Other types of metal silicide contacts may also be useful. The metal silicide contacts facilitate reduced contact resistance. To form silicide contacts, a metal layer may be deposited over the substrate and annealed to cause a reaction with silicon. Unreacted metal is removed by, for example, a wet etch, leaving the silicide contacts on the gate electrode the source region.

Referring to FIG. 3e, a dielectric layer 290 is formed over the substrate, covering the memory cell. The dielectric layer, for example, is a silicon oxide layer. The dielectric layer may be a high aspect ratio process (HARP) dielectric layer. Other types of dielectric materials including BPSG, PSG, USG, TEOS oxide, PEOX, HDP oxide, etc., may also be useful. The dielectric layer, for example, may be formed by CVD. Other suitable techniques may also be useful. The dielectric layer serves as a contact or pre-metal dielectric layer in which contacts 255 are formed to contact regions of the substrate.

To form contacts 255, a soft mask (not shown) may be used to form via or contact openings to the contact regions. The soft mask, for example, is a photoresist mask. To improve lithographic resolution, an anti-reflective coating (ARC) may be provided between the dielectric layer and soft mask. The soft mask is patterned to form openings corresponding to the contact regions. A conductive layer is then formed on the substrate, filling the openings and covering the dielectric layer 290. A planarizing process, such as CMP, removes excess conductive layer, forming contacts 255 having a planar surface with the top surface of the dielectric layer 290. Other techniques for forming contacts may also be useful. The contact 255 over the first S/D region is a bitline (BL) contact; the contact 255 over the second S/D region is a source line (SL) contact while contact coupled to the wordline is not shown in FIG. 3e.

The process may continue to complete the memory cell. For example, BEOL process including interconnect metal levels may be provided to form interconnections to the terminals of the transistor and other circuit components, as desired. Other processes may also be included to complete the memory cell or device, for example, final passivation, dicing and packaging.

Figure 4A:
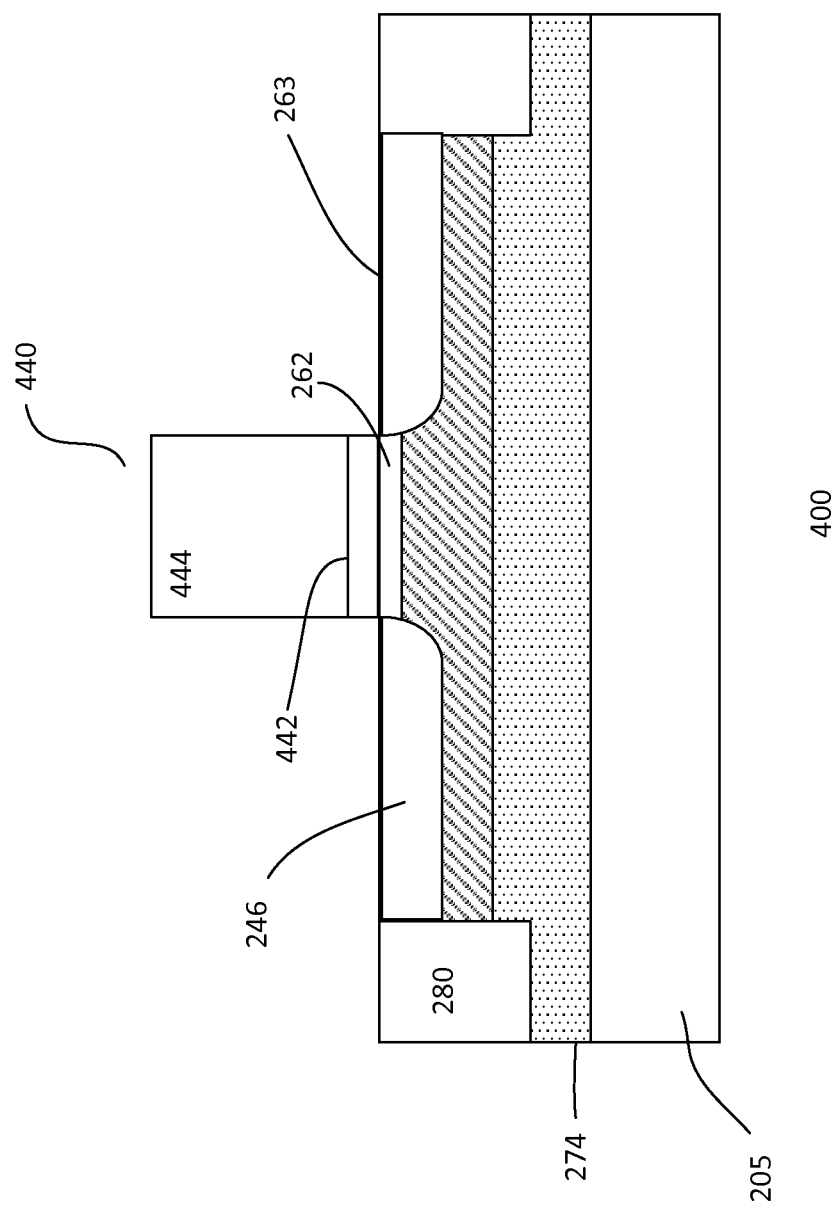
FIGS. 4a-4e show cross-sectional views of a process for forming another embodiment of a device.

FIGS. 4a-4e show cross-sectional views of a process for forming another embodiment of a device 400. The process may contain similar steps as that described in FIGS. 3a-3e. In the interest of brevity, common elements may not be described or described in detail. As shown in FIG. 4a, the partially processed substrate is at the stage similar to that described in FIG. 3c.

Referring to FIG. 4a, a dummy gate structure 440 is formed over the substrate. The dummy gate structure, as shown, includes a dummy gate dielectric 442 and dummy gate electrode 444. The dummy gate electrode, for example, includes polysilicon and the dummy gate dielectric, for example, includes silicon oxide. Various other suitable materials and techniques may be employed to form the dummy layer. For example, the dummy gate structure should include materials which can be removed or etched selectively to layers below or around it, such as spacers or dielectric layer as will be describe later. The dummy gate layers may be formed by, for example, CVD covering the device region. Other techniques, such as sputtering or spin coating may also be useful, depending on the material of the dummy layers. The thickness of the dummy gate electrode, for example, may be about 10-200 nm. Other suitable thickness dimensions may also be useful.

Similar to that described in FIG. 3d, first and second S/D extension regions 246 may be formed in the BE floating body regions adjacent to first and second sides of the dummy gate structure. As such, details of the S/D extension regions will not be described.

Figure 4B:
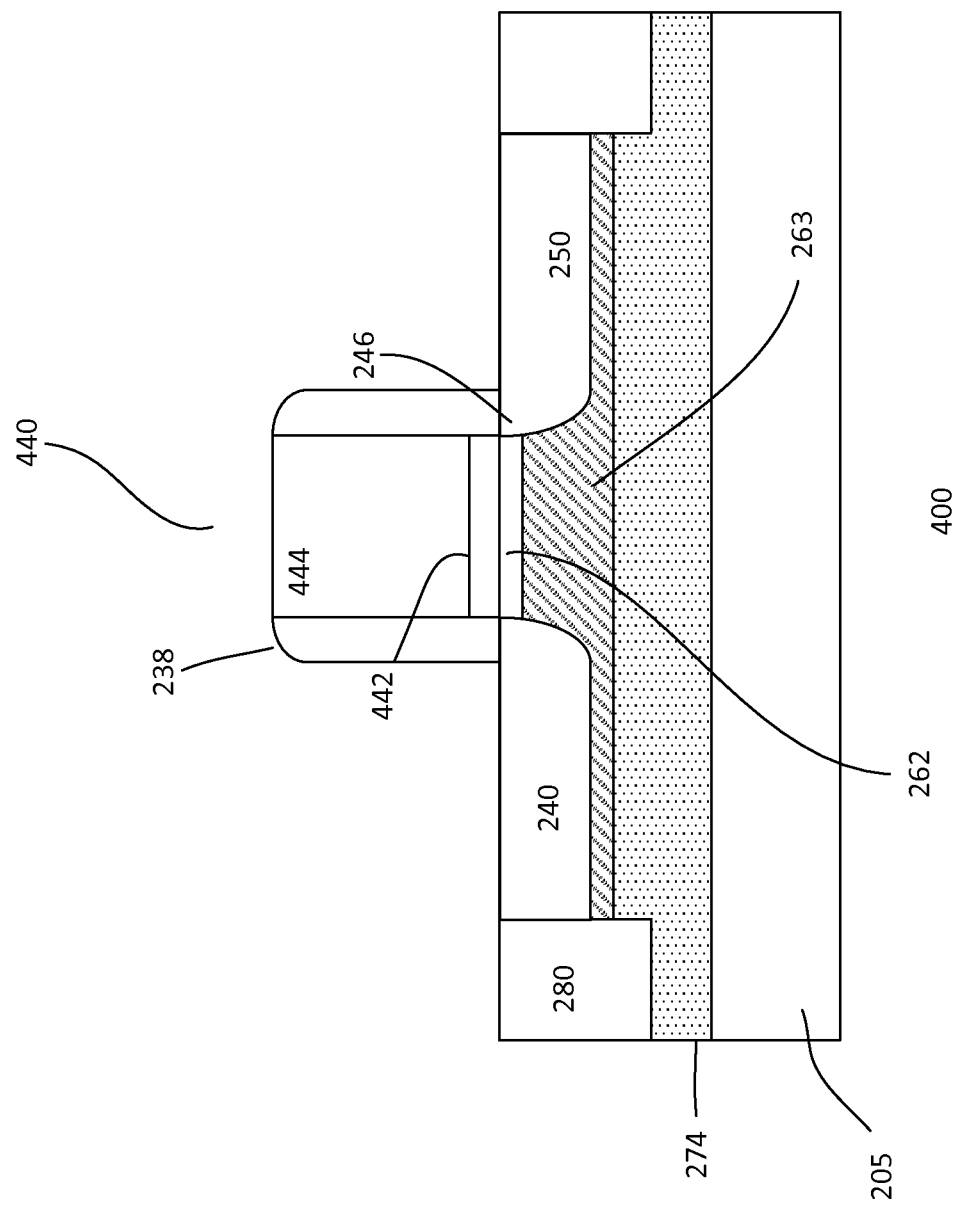

Referring to FIG. 4b, the process continues to form first and second sidewall spacers 238 and first and second S/D regions 240 and 250. The sidewall spacers 238 are formed on the first and second sides of the dummy gate structure 440. The gate sidewall spacers 238, for example, include silicon nitride. Other suitable types of spacer materials, such as silicon oxide or silicon oxynitride, may also be useful. The first and second S/D regions 240 and 250 are formed in the substrate adjacent to the dummy gate structure. The first and second S/D regions are formed in the BE floating body region 263. Techniques for forming the sidewall spacers and S/D regions are the same as that described in FIGS. 3d-3e. Other suitable techniques may also be useful.

Figure 4C:
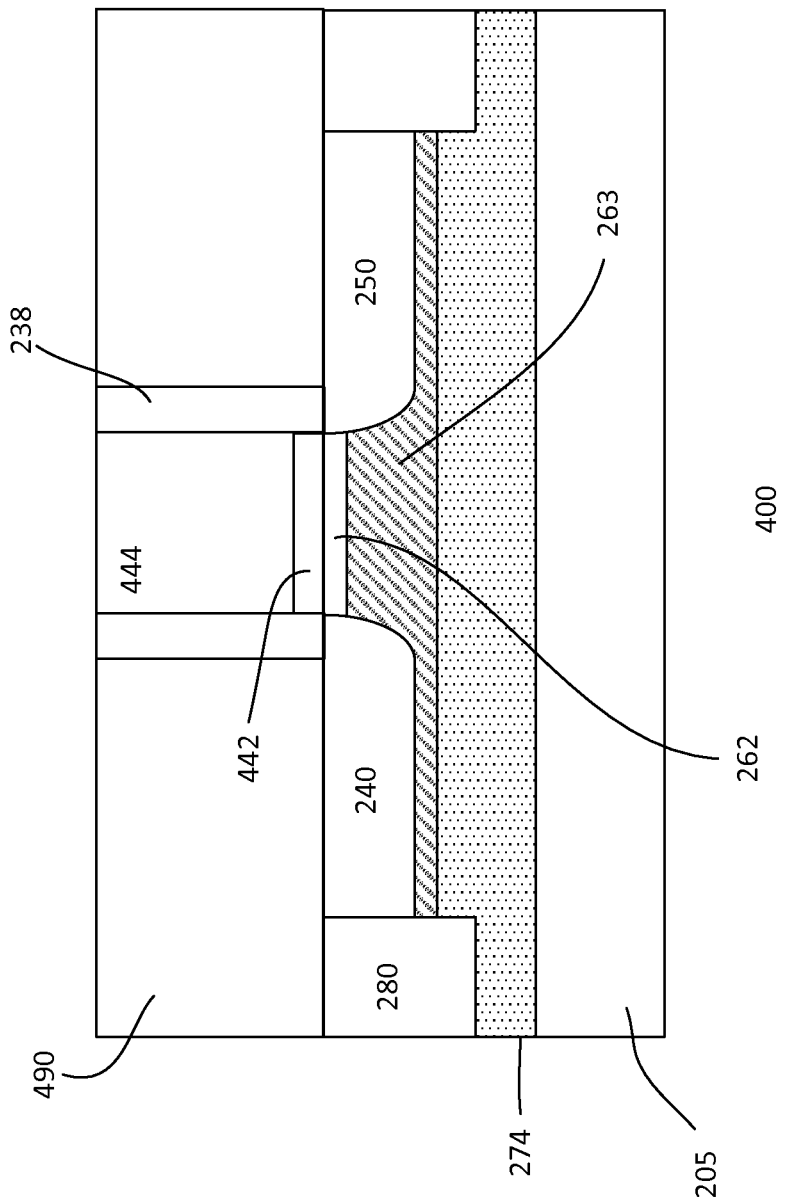

The process continues to form an interlevel dielectric (ILD) layer 490. Referring to FIG. 4c, a dielectric layer is deposited on the substrate, over the S/D regions 240 and 250, isolation regions 280 and dummy gate 440. The dielectric layer may be a silicon oxide. Other types of dielectric material may also be useful. Preferably, the ILD 490 is formed of a material which the dummy gate may be selectively removed to the ILD layer. The dielectric layer, for example, may be formed by CVD. Other suitable techniques may also be useful. Excess dielectric material of the ILD layer is removed by planarization process, such as CMP. Other types of planarization processes may also be useful. The CMP, for example, may use the dummy gate structure as a CMP stop. For example, the CMP forms a substantially coplanar surface between the top surface of the dummy gate, sidewall spacers and ILD layer.

Figure 4D:
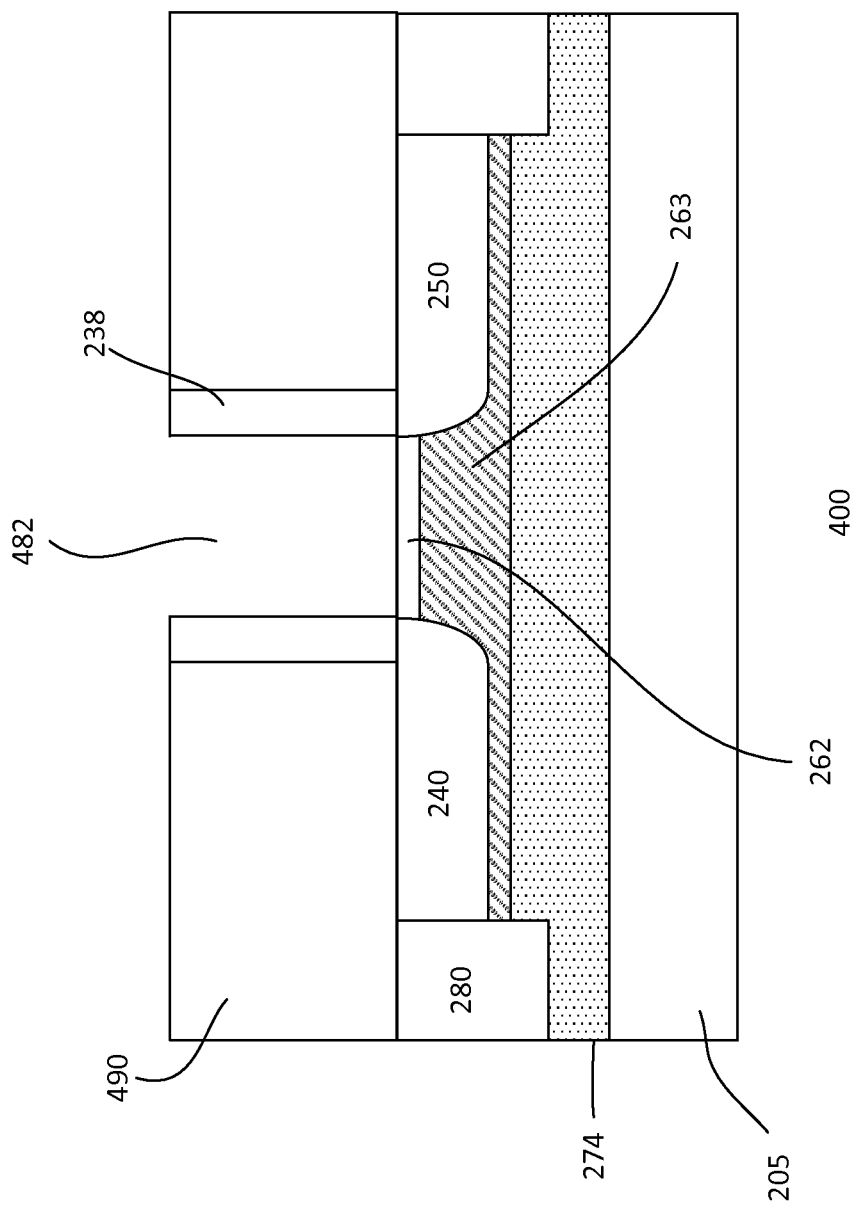

Referring to FIG. 4d, the dummy gate structure 440 is removed. A dual etch process using different chemistries, for example, may be employed to remove the dummy gate electrode and the dummy gate dielectric. For example, a dry etch followed by a wet etch/clean process are performed to remove the dummy gate electrode 444 by etch selectivity control of the dummy gate to the dielectric layer 490 and spacers 238. As for the removal of the dummy gate dielectric layer 442, in one embodiment, it is removed by reactive ion etch (RIE). Other suitable techniques for removing the dummy gate structure may also be useful. The removal of the dummy gate structure forms a gate opening 482 which exposes sides of the spacers 238 which are away from the ILD 490 as shown.

The process continues by forming a high-k metal gate structure. The high-k metal gate structure includes a gate dielectric 242 and a gate electrode 244. The gate dielectric, for example, includes high-k dielectric material, such as HfSiON, SiON or $HfO_2$. Other suitable types of dielectric materials may be useful. The thickness of the dielectric layer, for example, may be about 1-5 nm. The gate electrode layer, for example, includes metal or metal nitride. Various suitable types of metal, such as Ru, W, Pt, TiN, Ti, Zr, TaN, Si or Al, can be used. Other suitable types of metals may also be useful. The thickness of the gate electrode can be about 10-200 nm. Other suitable thickness dimensions for the gate dielectric and electrode layers may also be useful.

In some embodiments, a work function tuning layer may be formed in between the gate dielectric and the metal gate electrode layer. For example, $La_2O_3$ may be formed for an n-type device while TiN/Al/TiN may be formed for a p-type device in addition to HfSiON and/or $HfO_2$. Other configurations of gates may also be useful.

The gate dielectric and gate electrode layers are conformally formed on the substrate. For example, the gate dielectric layer lines the ILD, exposed sides of the sidewall spacers 238 and the exposed portion of the substrate while the gate electrode layer covers the gate dielectric layer and fills the gate opening 482. The gate dielectric layer may be formed by, for example, atomic layer deposition technique while the gate electrode layer is formed by sputtering or CVD. Forming the gate dielectric and gate electrode layers by other techniques may also be useful.

Figure 4E:
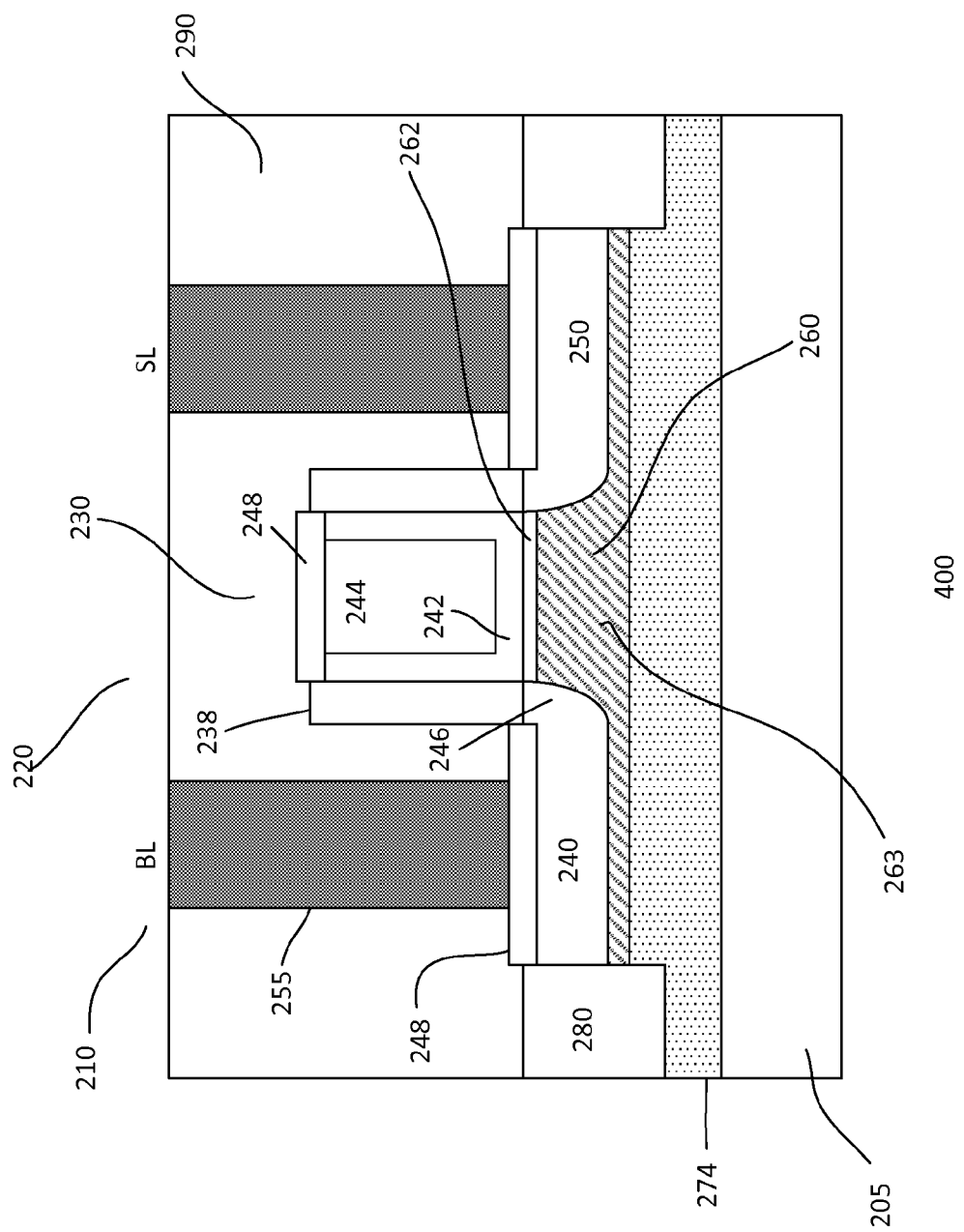

Referring to FIG. 4e, the substrate is planarized to remove excess gate dielectric and electrode materials. For example, the planarization process removes excess materials over the ILD layer. In one embodiment, the planarization process is CMP. Other types of planarization processes may also be useful. The CMP, for example, may use the ILD layer as a CMP stop. The planarization process forms a substantially coplanar surface with the ILD 490, the sidewalls spacers 238, the gate dielectric and gate electrode layers 242 and 244. The planarization process forms high-k metal gate structure in the gate opening.

The process may continue to complete the memory cell until a memory cell which is similar to FIG. 3e is formed. For example, metal silicide contacts 248 may be formed on the gate electrode (not shown) and S/D regions. The metal silicide contacts, for example, may be nickel-based metal silicide contacts. Other types of metal silicide contacts may also be useful. The metal silicide contacts facilitate reduced contact resistance. Additional processes further include forming additional dielectric layer to form the PMD layer 290, bitline and source line contacts 255 coupled to the S/D regions 240 and 250 and wordline contacts (not shown) coupled to the terminals of the memory cell or transistor as well as one or more interconnect levels, final passivation, dicing, assembly and packaging. Other processes may also be included. Techniques and materials of these features are the same as that already described in FIG. 3e. As such, details of these steps will not be described.

FIGS. 5a-5g show cross-sectional views of a process for forming another embodiment of a device 500. The process may contain similar steps as that described in FIGS. 3a-3e and FIGS. 4a-4e. In the interest of brevity, common elements may not be described or described in detail.

Figure 5A:
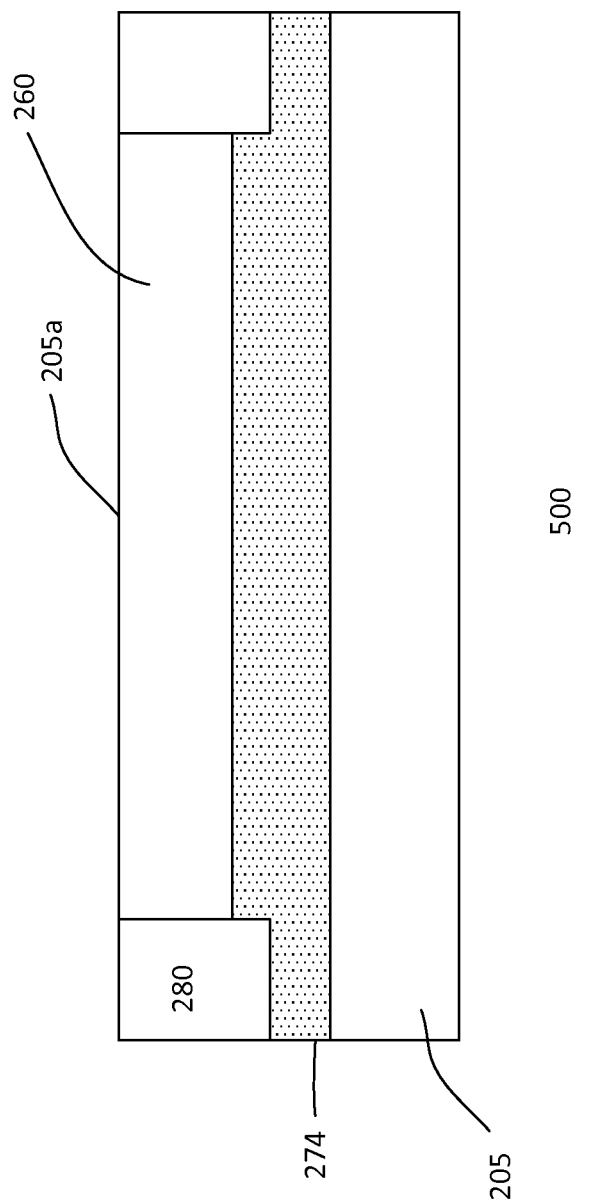
FIGS. 5a-5g show cross-sectional views of a process for forming another embodiment of a device.
Figure 5B:
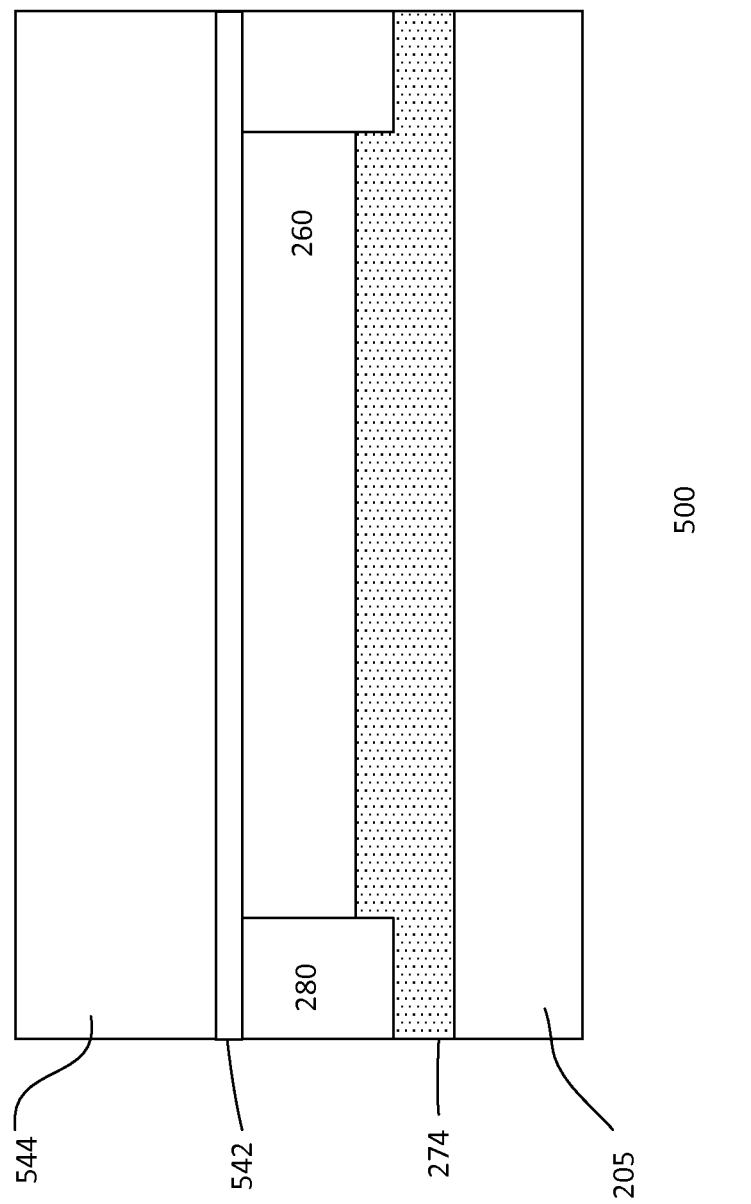

Referring to FIG. 5a, the substrate 205 is prepared with isolation regions 280 and is processed to form an isolation well 274, similar to that shown in FIG. 3a. The techniques and parameters for forming the isolation well is the same as that described in FIG. 3a. As shown in FIG. 3a, the area of the substrate between the top of the isolation well, the isolation regions and substrate top surface serves as a floating body region 260. The area of the substrate between the top of the isolation well, the isolation regions and the substrate top surface, as shown in FIG. 3a, is not processed. In one embodiment, the top of the isolation well should have a depth sufficient to accommodate the floating body region. For example, the top of the isolation well should be about 5-100 nm deep from the surface of the substrate 205a.

The process continues to form dummy gate layers. Referring to FIG. 4b, a dummy gate dielectric 542 and a dummy gate electrode layer 544 are formed over the substrate. The dummy gate electrode layer 544, for example, includes polysilicon and the dummy gate dielectric layer 542, for example, includes silicon oxide. Various other suitable materials and techniques may be employed to form the dummy gate layers. For example, the dummy gate layers should include materials which can be removed or etched selectively to layers below or around it, such as spacers or dielectric layer as will be described later. The dummy gate layers may be formed by, for example, CVD covering the device region. Other techniques, such as sputtering or spin coating may also be useful, depending on the material of the dummy layers. The thickness of the dummy gate dielectric and the dummy gate electrode layers, for example, may be about 1-50 nm and 10-200 nm, respectively. Other suitable thickness dimensions may also be useful.

Figure 5C:
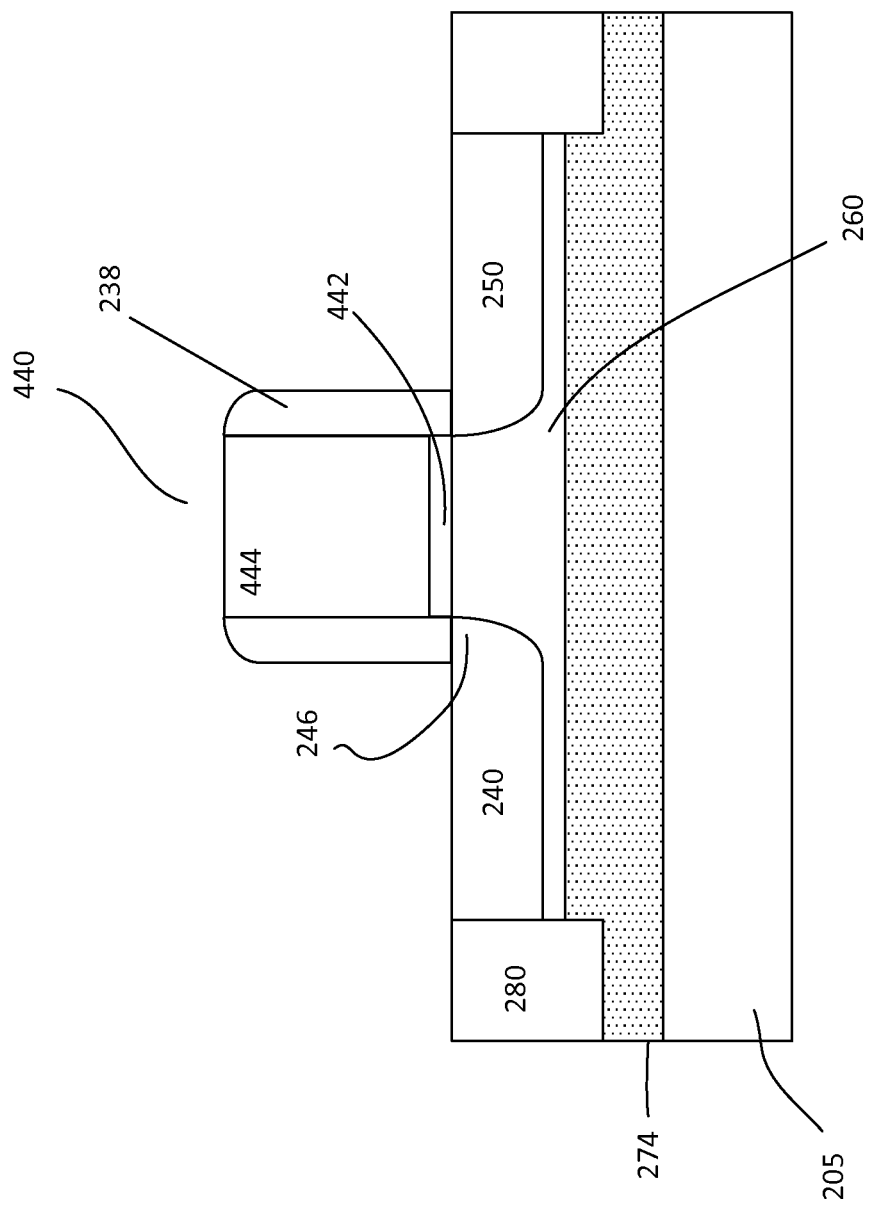

Referring to FIG. 5c, the dummy gate layers are patterned to form a dummy gate structure 440 over the substrate. The dummy gate structure, as shown, includes a dummy gate dielectric 442 and dummy gate electrode 444. The dummy gate structure, for example, may be formed by mask and etch technique. For example, a patterned photoresist mask may be used as an etch mask for an anisotropic etch, such as a reactive ion etch (RIE). To improve lithographic resolution, an ARC can be provided beneath the photoresist. Other techniques for patterning the dummy gate layers may also be useful. After patterning the dummy gate layers, the mask, including the ARC layer, may be removed. Other suitable techniques may also be employed to form the dummy gate structure.

As shown in FIG. 5c, the process continues to form lightly doped S/D extension regions, sidewall spacers 238 and heavily doped S/D regions 240 and 250, similar to that described in FIGS. 4a and 4b. The materials, features and techniques used to form these features are the same as that described in FIGS. 4a-4b. As such, details of the process steps will not be described.

Figure 5D:
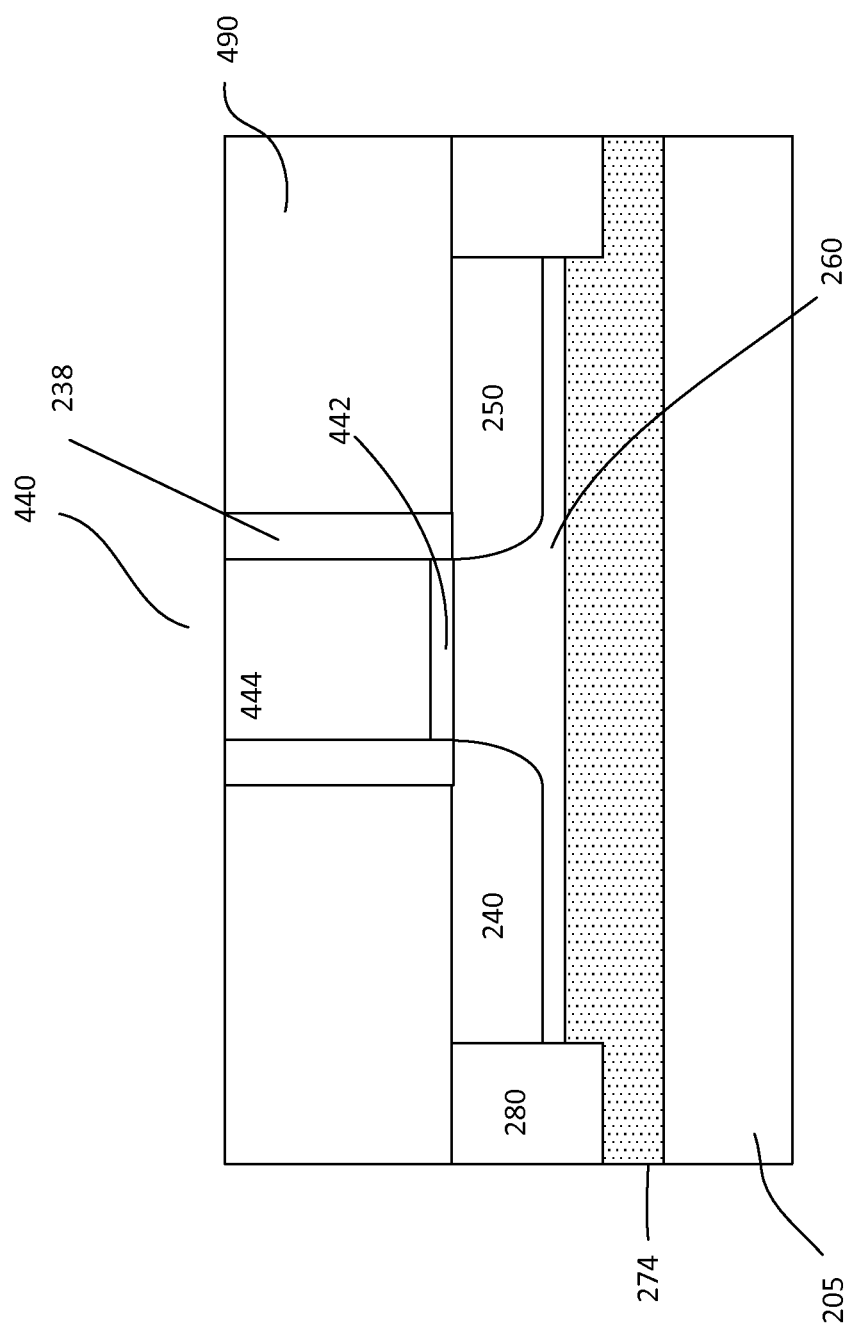

An interlevel dielectric (ILD) layer 490 is deposited on the substrate, over the S/D regions 240 and 250, isolation regions 280 and dummy gate 440 as shown in FIG. 5d. Excess dielectric material of the ILD layer is removed by planarization process, such as CMP. The dielectric layer 490 includes the same material and processed in the same way as that described in FIG. 4c.

Figure 5E:
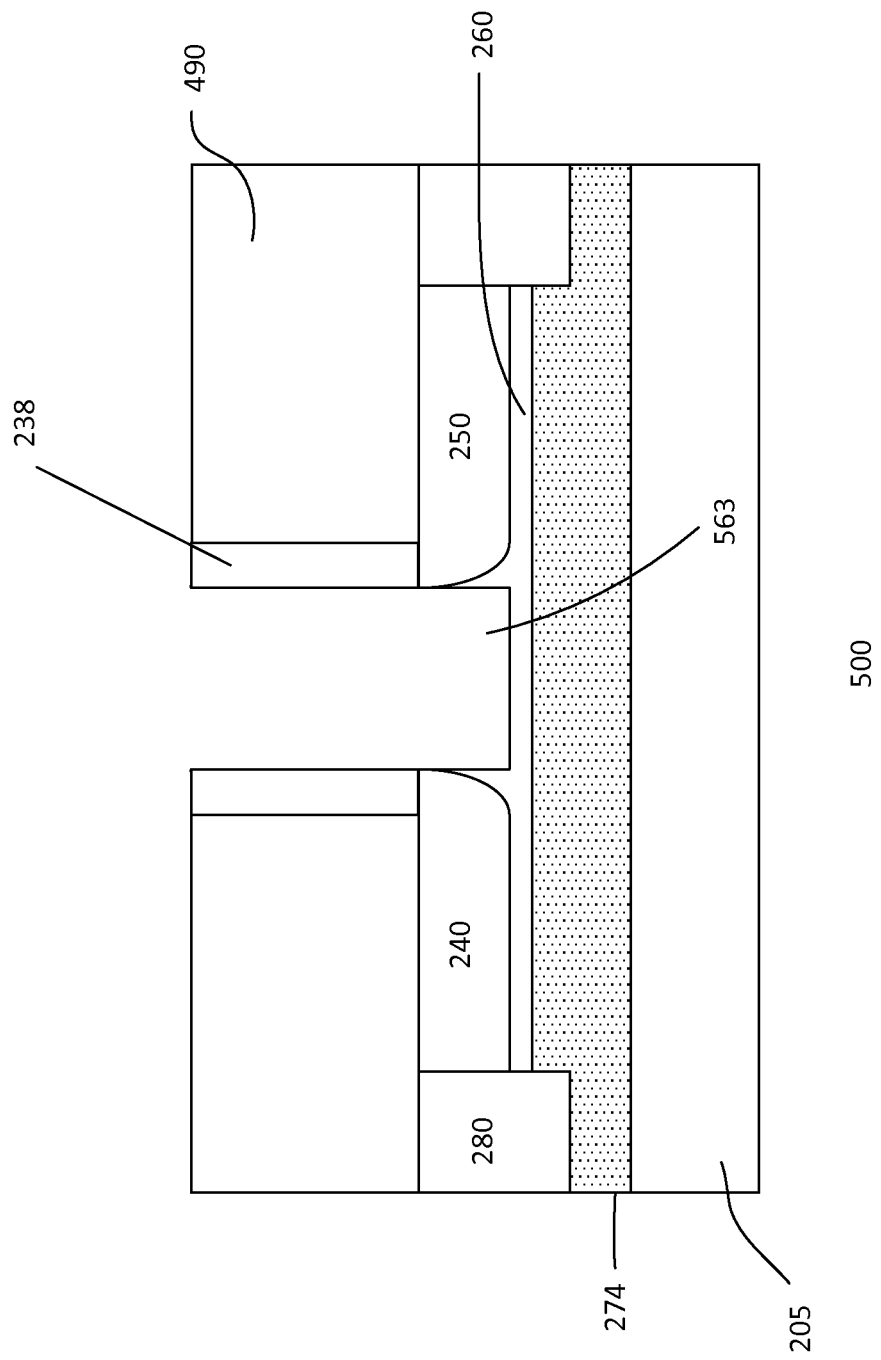

Referring to FIG. 5e, the process continues to remove the dummy gate structure 440. For example, a dual etch process using different chemistries, may be employed to remove the dummy gate electrode and the dummy gate dielectric, the same as that described in FIG. 4d. The removal of the dummy gate structure forms a gate opening which exposes sides of the spacers 238 which are away from the ILD 490 as shown in FIG. 4e.

A trench 563 is formed within a portion of the floating body 260 and in between the S/D regions 240 and 250 as shown in FIG. 5e. A mask and etch process is employed to remove portions of the substrate within the floating body to form the trench 563. For example, the trench is formed by RIE. The sides of the trench, for example, are self-aligned to the S/D extension regions. As shown, the depth of the trench is about equal to the depth of the S/D regions. Providing other depths or configurations may also be useful.

Figure 5F:
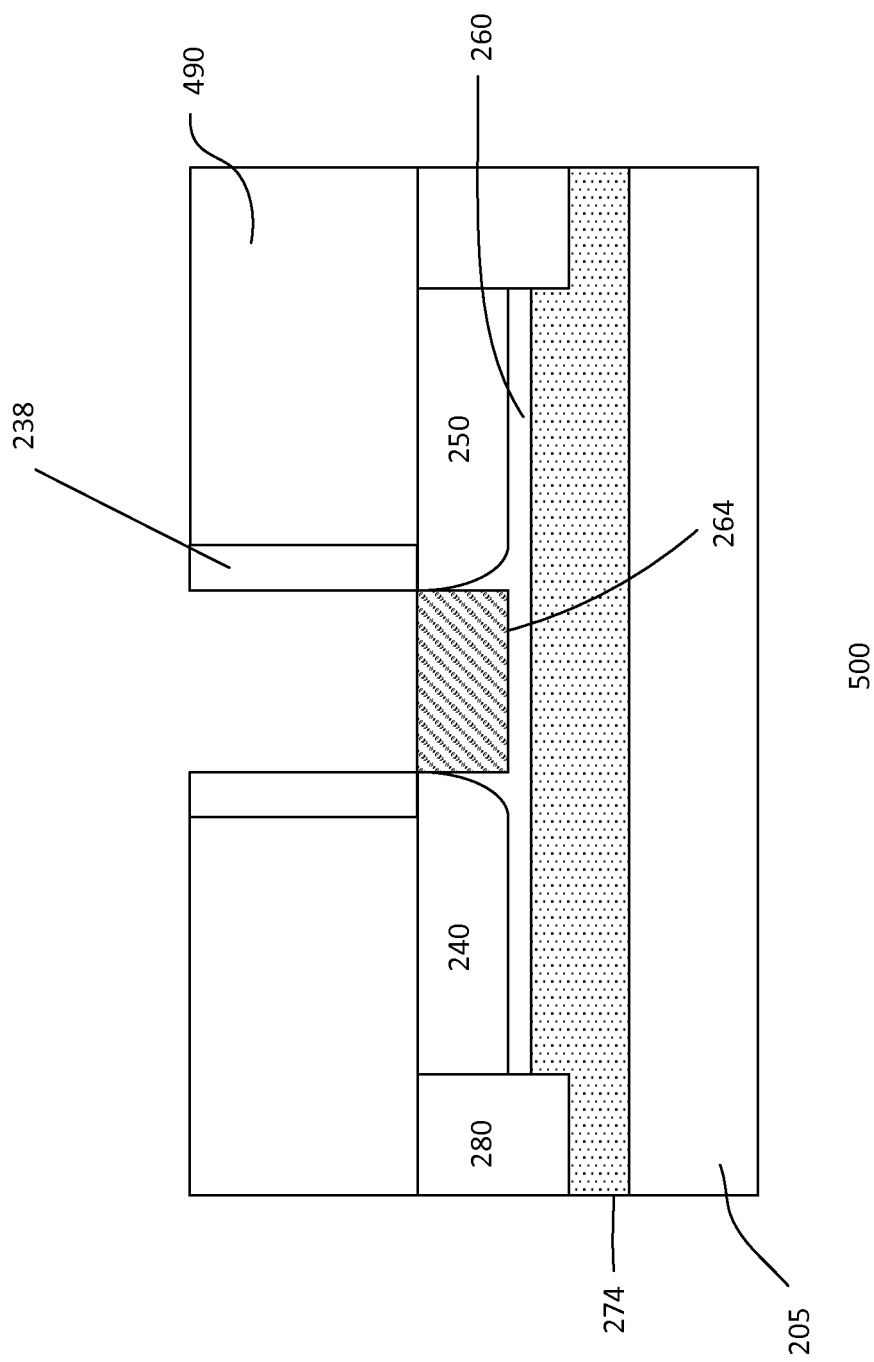

Referring to FIG. 5f, a band engineered (BE) portion 264 is formed within the trench 563. The BE portion is formed by, for example, selective epitaxial growth (SEG) process, filling the spaces within the recessed channel. As shown, the top of the BE portion is about coplanar with the top of the substrate surface. For example, the top of BE portion is also substantially coplanar with the top surface of the S/D regions 240 and 250. Forming the BE portion which is slightly recessed or over the substrate surface or the top surface of the S/D regions may also be useful. The BE portion, in one embodiment, is a silicon germanium (SiGe) BE portion. In another embodiment, the BE portion is lightly doped with second polarity type dopants. Other suitable types of BE portion may also be useful. For applications with BE portion, the floating body 260 may be modified to include Si:C. For example, the floating body 260 may be doped with C dopants. The concentration of C is, for example, 1-3%. Other techniques for providing a Si:C body may also be useful. For example, the body may be an epitaxial Si:C body. The epitaxial body may be in-situ doped Implanting the epitaxial body may also be useful. For applications without BE portion, S/D regions may be doped with C dopants. For example, Si:C S/D regions may be disposed within a Si body.

Figure 5G:
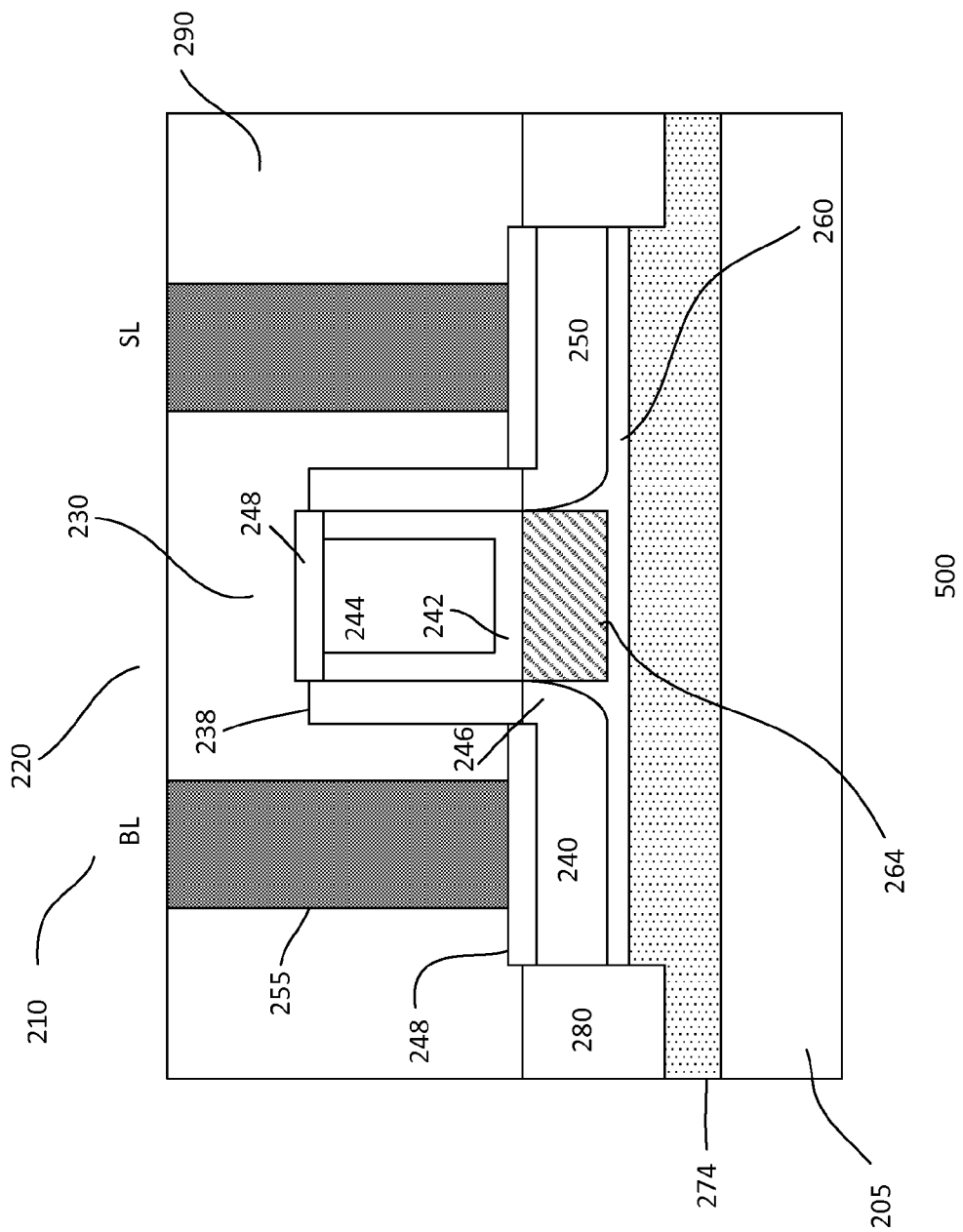

Referring to FIG. 5g, the process continues to form a high-k metal gate structure. The materials and techniques for forming the high-k metal gate structure is the same as that described in FIG. 4e. The process may continue to complete the memory cell. For example, the process continues to form silicide contacts, ILD layer, contacts etc. Additional processes may be performed, including forming one or more interconnect levels, final passivation, dicing, assembly and packaging. Techniques and materials of these features are the same as that already described in FIG. 4e. As such, details of these steps will not be described.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate having top and bottom surfaces, wherein the substrate comprises a first semiconductor material;
   an isolation well disposed below the top substrate surface and an area of the substrate between the isolation well and the top substrate surface serves as a body region of a transistor, wherein the isolation well isolates the body region from the substrate;
   a floating body having a second semiconductor material different than the first semiconductor material disposed over the isolation well and within the body region, wherein the second semiconductor material is a band engineered (BE) material such that the floating body is a BE floating body; and
   a transistor disposed over the substrate, the transistor comprises
      a gate disposed on the top substrate surface, and
      first and second diffusion regions disposed in the body region adjacent to first and second sides of the gate.

2. The device of claim 1 wherein the isolation well comprises first polarity type dopants and the BE floating body comprises second polarity type dopants and the BE floating body comprises a depth deeper or equal to about a depth of the first and second diffusion regions.

3. The device of claim 1 wherein the BE floating body contacts the isolation well and the first and second diffusion regions are disposed in the BE floating body.

4. The device of claim 3 comprising a channel layer having top and bottom planar surfaces which is disposed over the BE floating body which contacts the isolation well.

5. The device of claim 3 wherein:
   the transistor is a first polarity type transistor;
   the first and second diffusion regions comprise heavily doped first polarity type dopants; and
   the substrate and the BE floating body comprise lightly doped second polarity type dopants.

6. The device of claim 4 wherein the BE floating body comprises a silicon germanium (SiGe) BE floating body and the channel layer comprises a Si:C layer.

7. The device of claim 1 wherein the gate comprises a gate electrode layer over a gate dielectric layer, wherein
   the gate electrode layer comprises polysilicon or metal; and
   the gate dielectric layer comprises silicon oxide or high-k dielectric material.

8. The device of claim 1 wherein the BE floating body is a BE portion disposed in a trench below the gate and between the first and second diffusion regions, wherein the trench has a depth equal to about a depth of the first and second diffusion regions and a gap exists between a top surface of the isolation well and a bottom of the BE portion.

9. The device of claim 8 wherein the BE floating body comprises a silicon germanium (SiGe) BE floating body.

10. A method for forming a device comprising:
    providing a substrate having top and bottom surfaces, wherein the substrate comprises a first semiconductor material;
    forming an isolation well below the top substrate surface, wherein an area of the substrate between the isolation well and the top substrate surface serves as a body region of a transistor, and the isolation well isolates the body region from the substrate;
    forming a floating body having a second semiconductor material different than the first semiconductor material over the isolation well and within the body region, wherein the second semiconductor material is a band engineered (BE) material such that the floating body is a BE floating body; and
    forming a transistor over the substrate, wherein forming the transistor comprises
       forming a gate on the top substrate surface, and
       forming first and second diffusion regions in the body region adjacent to first and second sides of the gate.

11. The method of claim 10 wherein:
  forming the isolation well comprises implanting first polarity type dopants into the substrate; and
  the BE floating body is formed by an epitaxial process and comprises second polarity type dopants.

12. The method of claim 11 wherein the BE floating body contacts the isolation well and comprising forming a channel layer over the BE floating body by an epitaxial process, wherein the channel layer comprises top and bottom planar surfaces and is formed prior to forming the first and second diffusion regions.

13. The method of claim 12 wherein the BE floating body comprises a silicon germanium (SiGe) BE floating body and the channel layer comprises a Si:C layer.

14. The method of claim 11 wherein forming the gate comprises forming a gate dielectric layer over the substrate and forming a gate electrode layer over the gate dielectric layer, wherein
  the gate electrode layer comprises polysilicon or metal; and
  the gate dielectric layer comprises silicon oxide or high-k dielectric material.

15. The method of claim 14 wherein the first and second diffusion regions are formed by:
  forming trenches in portions of the BE floating body adjacent to the gate; and
  forming the first and second diffusion regions by an epitaxial process.

16. The method of claim 11 comprising:
  forming a dummy gate structure over the substrate;
  forming an interlevel dielectric (ILD) layer over the substrate; and
  removing the dummy gate structure after forming the ILD layer to form a gate opening, wherein the gate opening expose a portion of the top substrate surface.

17. The method of claim 16 comprising forming a gate dielectric layer over the substrate and lining the gate opening and forming a gate electrode layer over the gate dielectric layer and filling remaining portion of the gate opening, wherein
  the gate electrode layer comprises metal; and
  the gate dielectric layer comprises high-k dielectric material.

18. The method of claim 16 wherein the BE floating body is a BE portion disposed between the first and second diffusion regions and a gap exists between a top surface of the isolation well and a bottom of the BE portion and the BE portion is formed by:
  forming a trench having a depth equal to about a depth of the first and second diffusion regions within a portion of the body region and in between the first and second diffusion regions; and
  forming the BE portion by a selective epitaxial growth process in the trench, wherein the BE portion comprises the same band engineered material which completely fills the trench.

19. The method of claim 18 wherein the BE portion comprises a silicon germanium (SiGe) BE portion.

20. The method of claim 18 comprising forming a gate dielectric layer over and in direct contact with the BE portion and lining the gate opening and forming a gate electrode layer over the gate dielectric layer and filling remaining portion of the gate opening, wherein
  the gate electrode layer comprises metal; and
  the gate dielectric layer comprises high-k dielectric material.

* * * * *